United States Patent
Lee et al.

(10) Patent No.: US 11,903,250 B2
(45) Date of Patent: Feb. 13, 2024

(54) DISPLAY APPARATUS AND METHOD OF MANUFACTURING THE SAME

(71) Applicant: Samsung Display Co., Ltd., Yongin-si (KR)

(72) Inventors: Seungjin Lee, Yongin-si (KR); Sanghoon Kim, Yongin-si (KR); Jongsung Park, Yongin-si (KR); Sangshin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 246 days.

(21) Appl. No.: 17/443,937

(22) Filed: Jul. 28, 2021

(65) Prior Publication Data

US 2022/0109122 A1    Apr. 7, 2022

(30) Foreign Application Priority Data

Oct. 7, 2020    (KR) .................. 10-2020-0129600

(51) Int. Cl.
| | |
|---|---|
| *H01L 51/52* | (2006.01) |
| *H01L 51/56* | (2006.01) |
| *H01L 27/32* | (2006.01) |
| *H10K 59/121* | (2023.01) |
| *H10K 50/81* | (2023.01) |
| *H10K 59/35* | (2023.01) |
| *H10K 71/00* | (2023.01) |
| *H10K 71/16* | (2023.01) |

(Continued)

(52) U.S. Cl.
CPC ......... *H10K 59/121* (2023.02); *C23C 14/042* (2013.01); *H10K 50/81* (2023.02); *H10K 59/353* (2023.02); *H10K 71/00* (2023.02); *H10K 71/166* (2023.02); *H10K 50/11* (2023.02); *H10K 59/1201* (2023.02); *H10K 59/122* (2023.02); *H10K 59/352* (2023.02); *H10K 2102/341* (2023.02)

(58) Field of Classification Search
CPC ......... H10K 59/35–353; H10K 59/121; H10K 59/122; H10K 71/166; H10K 2102/341
See application file for complete search history.

(56) References Cited

U.S. PATENT DOCUMENTS

| | | |
|---|---|---|
| 6,946,783 B2 | 9/2005 | Kim |
| 9,343,708 B2 | 5/2016 | Hong et al. |

(Continued)

FOREIGN PATENT DOCUMENTS

| | | | | |
|---|---|---|---|---|
| CN | 110047893 A | * | 7/2019 | ........... H10K 50/824 |
| CN | 110047893 A | | 7/2019 | |

(Continued)

OTHER PUBLICATIONS

Machine translation, Chen, Chinese Pat. Pub. No. CN110047893A, translation date: Apr. 26, 2023, Espacenet, all pages. (Year: 2023).*

*Primary Examiner* — Victoria K. Hall
(74) *Attorney, Agent, or Firm* — Lewis Roca Rothgerber Christie LLP

(57) ABSTRACT

A display apparatus includes a substrate, a pixel definition layer arranged over the substrate and including at least one opening area, and an organic emission layer arranged over the pixel definition layer and covering the opening area, wherein a center of the opening area and a center of the organic emission layer are arranged at different positions in a plan view.

19 Claims, 34 Drawing Sheets

(51) Int. Cl.
*C23C 14/04* (2006.01)
*H10K 50/11* (2023.01)
*H10K 59/122* (2023.01)
*H10K 59/12* (2023.01)
*H10K 102/00* (2023.01)

(56) References Cited

U.S. PATENT DOCUMENTS

| 11,538,877 | B2* | 12/2022 | Xu | H10K 59/352 |
| 2020/0357871 | A1* | 11/2020 | Chung | H10K 50/865 |
| 2021/0257422 | A1* | 8/2021 | Xu | H10K 71/191 |
| 2023/0070304 | A1* | 3/2023 | Shin | H10K 59/80515 |

FOREIGN PATENT DOCUMENTS

| CN | 110212013 A | 9/2019 |
| KR | 10-0469252 B1 | 2/2005 |
| KR | 10-2014479 B1 | 8/2019 |

* cited by examiner

DISPLAY APPARATUS AND METHOD OF MANUFACTURING THE SAME

CROSS-REFERENCE TO RELATED APPLICATION

This application claims priority to and the benefit of Korean Patent Application No. 10-2020-0129600, filed on Oct. 7, 2020, in the Korean Intellectual Property Office, the entire content of which is incorporated herein by reference.

BACKGROUND

1. Field

One or more embodiments of the present disclosure relate to apparatuses and methods, and more particularly, to a display apparatus and a method of manufacturing the same.

2. Description of Related Art

Electronic apparatuses that have mobility have been widely used. Recently, in addition to small electronic apparatuses such as mobile phones, tablet personal computers (PCs) have been widely used as mobile electronic apparatuses.

Such mobile electronic apparatuses include a display apparatus to provide visual information such as images and/or videos to a user in order to support various functions. Recently, as other components for driving a display apparatus have been miniaturized, the proportion of an electronic apparatus occupied by a display apparatus has increased gradually, and a structure capable of being bent from a flat state to have a certain angle has also been developed.

Such a display apparatus may include a subpixel that emits light, and the subpixel may be formed by stacking various layers. In one or more embodiments, precise adjustment of the positions of various layers forming the subpixel is quite an important issue for the performance of the display apparatus.

SUMMARY

In related art, because a mask sheet used to form an organic emission layer is tensioned and used, the position of an opening portion of the mask sheet may be different from a designed (or desired) position thereof. In this case, it may be difficult to implement a clear image when a display apparatus operates. One or more embodiments of the present disclosure include a display apparatus for providing a clear image and a method of manufacturing a display apparatus for providing a clear image.

Additional embodiments will be set forth in part in the description which follows and, in part, will be apparent from the description, or may be learned by practice of the presented embodiments.

According to one or more embodiments, a display apparatus includes a substrate, a pixel definition layer over the substrate, the pixel definition layer including at least one opening area, and an organic emission layer over the pixel definition layer and covering (e.g., shielding) the opening area, wherein a center of the opening area and a center of the organic emission layer are at different positions in a plan view.

In one or more embodiments, the opening area may be inside the organic emission layer in a plan view.

In one or more embodiments, the display apparatus may further include a pixel electrode on the substrate and the pixel definition layer, the pixel electrode being exposed to the outside through the opening area.

In one or more embodiments, a center of the pixel electrode may be at a different position than at least one of the center of the organic emission layer and the center of the opening area in a plan view.

In one or more embodiments, a first length of a first portion of the pixel electrode at one of two ends of the opening area along one direction and inside the pixel definition layer, may be different from a second length of a second portion of the pixel electrode at another of the two ends of the opening area and inside the pixel definition layer.

In one or more embodiments, a distance from the center of the opening area to one of ends of the organic emission layer along one direction may be different from a distance from the center of the opening area to another of the ends of the organic emission layer.

In one or more embodiments, a linear distance from an edge of the opening area to an edge of the organic emission layer may be different at two set points on the edge of the opening area.

In one or more embodiments, the organic emission layer may include an organic emission layer that emits one of red, green, or blue colors.

According to one or more embodiments, a display apparatus includes a substrate, a pixel definition layer over the substrate, the pixel definition layer including a plurality of opening areas, and a plurality of organic emission layers over the pixel definition layer and respectively covering (e.g., shielding) each of the plurality of opening areas, wherein a first distance between a center of a first organic emission layer among the plurality of organic emission layers and a center of a first opening area among the plurality of opening areas and corresponding to the first organic emission layer in a plan view is different from a second distance between a center of a second organic emission layer among the plurality of organic emission layers and a center of a second opening area among the plurality of opening areas and corresponding to the second organic emission layer in a plan view.

In one or more embodiments, the first organic emission layer and the second organic emission layer may emit a same color.

In one or more embodiments, the center of the first organic emission layer and the center of the first opening area may be aligned with each other.

In one or more embodiments, a distance from an edge of the first organic emission layer to an edge of the first opening area may be uniform along the edge of the first opening area.

In one or more embodiments, a distance from an edge of the second organic emission layer to an edge of the second opening area may be different in at least two points on the edge of the second opening area.

In one or more embodiments, at least one of the first organic emission layer and the second organic emission layer may overlap, in a plan view, one or more of the plurality of organic emission layers that emit a color different from a color that the first organic emission layer and the second organic emission layer are to emit.

According to one or more embodiments, a method of manufacturing a display apparatus includes aligning a mask sheet with a display substrate, when a position of the mask sheet and a position of the display substrate are misaligned with each other, shifting at least one of a plurality of opening areas of a pixel definition layer to a position different from an existing position thereof, and depositing a deposition material that passed through an opening portion of the mask sheet, in an opening area of the pixel definition layer.

In one or more embodiments, the opening area of the pixel definition layer may be shifted such that a center of a pixel electrode arranged under the pixel definition layer and a center of the opening area may be misaligned with each other.

In one or more embodiments, the deposition material may entirely cover (e.g., shield) the opening area.

In one or more embodiments, a center of the opening portion of the mask sheet may be misaligned with a center of the opening area.

In one or more embodiments, the opening area may include a plurality of opening areas, and the opening portion may overlap one of the plurality of opening areas in a plan view.

Other embodiments, aspects, features, and advantages other than those described above will become apparent from the accompanying drawings, the appended claims and their equivalents, and the detailed description of the disclosure.

These general and particular aspects may be implemented by using systems, methods, computer programs, or any combinations of systems, methods, and computer programs.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
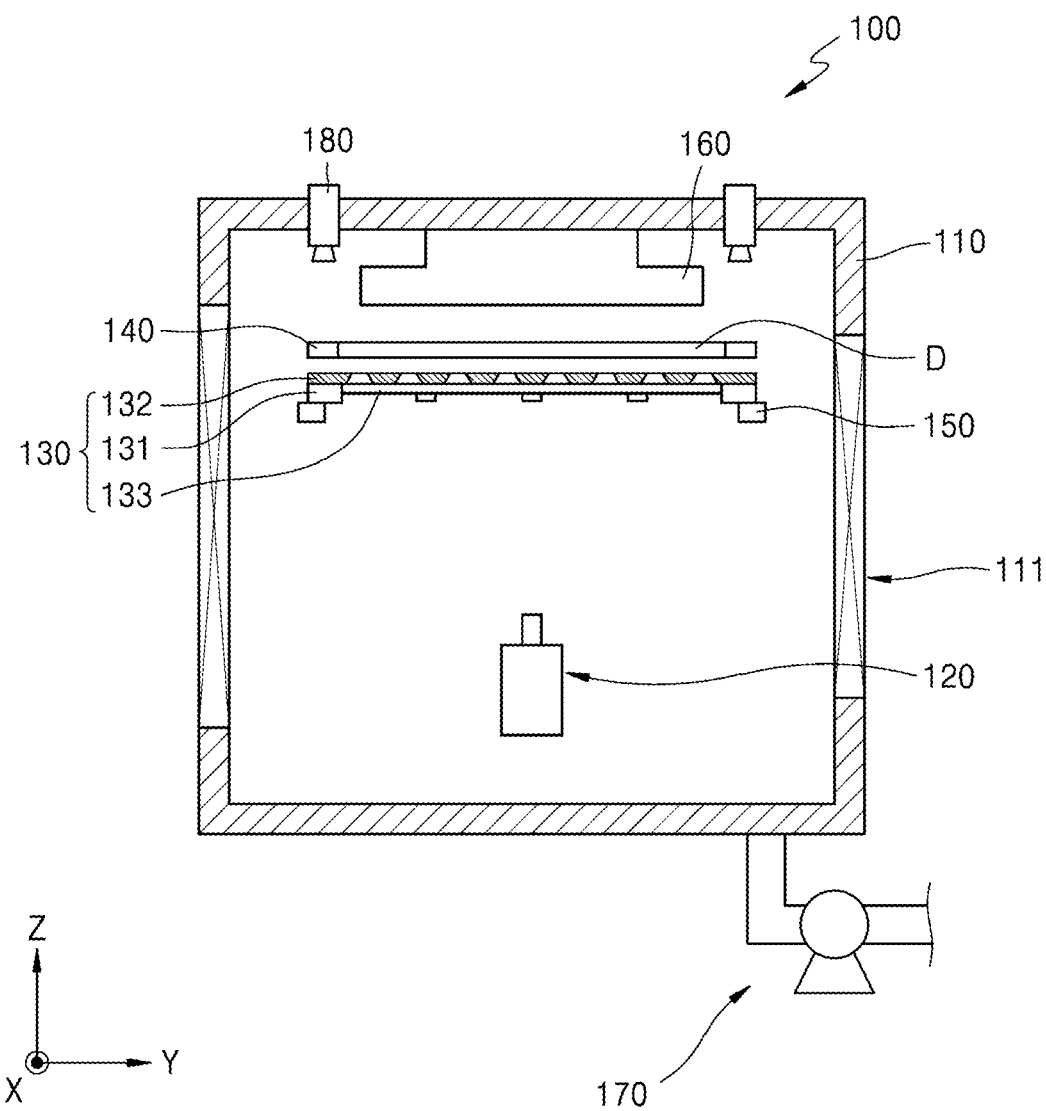
FIG. 1 is a cross-sectional view illustrating a display apparatus manufacturing apparatus according to one or more embodiments.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, expressions such as "at least one of", "one of", and "selected from", when preceding a list of elements, modify the entire list of elements and do not modify the individual elements of the list. For example, the expression "at least one of a, b or c" indicates only a, only b, only c, both a and b, both a and c, both b and c, all of a, b, and c, or variations thereof. Further, the use of "may" when describing embodiments of the present disclosure refers to "one or more embodiments of the present disclosure".

The disclosure may include various embodiments and modifications, and certain embodiments thereof are illustrated in the drawings and will be described herein in more detail. The effects and features of the disclosure and the accomplishing methods thereof will become apparent from the embodiments described below with reference to the accompanying drawings. However, the disclosure is not limited to the embodiments described below and may be embodied in various modes.

Hereinafter, embodiments will be described in more detail with reference to the accompanying drawings, and in the following description, like reference numerals will denote like elements and redundant descriptions thereof will not be provided for conciseness.

It will be understood that although terms such as "first" and "second" may be used herein to describe various elements, these elements should not be limited by these terms and these terms are only used to distinguish one element from another element.

As used herein, the singular forms "a," "an," and "the" are intended to include the plural forms as well, unless the context clearly indicates otherwise.

Also, it will be understood that the terms "comprise," "include," and "have" used herein specify the presence of stated features or elements, but do not preclude the presence or addition of one or more other features or elements.

It will be understood that when a layer, region, or element is referred to as being "on" another layer, region, or element, it may be "directly on" the other layer, region, or element (with no intervening layers, regions, or elements therebetween), or may be "indirectly on" the other layer, region, or element (with one or more intervening layers, regions, or elements therebetween).

Sizes of elements in the drawings may be exaggerated for convenience of description. In other words, because the sizes and thicknesses of elements in the drawings are arbitrarily illustrated for convenience of description, the disclosure is not limited thereto.

Also, herein, the X axis, the Y axis, and the Z axis are not limited to three axes of the rectangular coordinate system and may be interpreted in a broader sense. For example, the X axis, the Y axis, and the Z axis may be perpendicular to one another or may represent different directions that are not perpendicular to one another.

As used herein, the terms "use," "using," and "used" may be considered synonymous with the terms "utilize," "utilizing," and "utilized," respectively.

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

When a certain embodiment may be implemented differently, a particular process order may be performed differently from the described order. For example, two consecutively described processes may be performed substantially at the same time or may be performed in an order opposite to the described order.

FIG. 1 is a cross-sectional view illustrating a display apparatus manufacturing apparatus according to embodiments.

Referring to FIG. 1, a display apparatus manufacturing apparatus 100 may include a chamber 110, a deposition source 120, a mask assembly 130, a first support unit 140, a second support unit 150, a magnetic force generator 160, a pressure adjuster 170, and a vision unit 180.

The chamber 110 may have a space formed therein, and one side thereof may be formed to open, such that a display substrate D may be withdrawn or accommodated therethrough. In one or more embodiments, a shielding unit 111 including a gate valve and/or the like may be arranged at an open portion of the chamber 110 to selectively open or close.

The deposition source 120 may accommodate a deposition material for forming at least one of intermediate layers. In one or more embodiments, the deposition source 120 may vaporize or sublimate the deposition material by applying energy (e.g., thermal energy, light energy, vibration energy, and/or the like) thereto.

The deposition source 120 described above may be replaceable. For example, the deposition source 120 may be replaced with a new deposition source 120 when the accommodated deposition material is exhausted.

The mask assembly 130 may include a mask frame 131, a mask sheet 132, and a support frame 133.

The first support unit 140 may support the display substrate D. In one or more embodiments, the first support unit 140 may support the display substrate D by mounting the display substrate D, or may support the display substrate D by adsorbing or attaching one surface of the display substrate D. For example, the first support unit 140 may include a frame, a bar, and/or the like fixed inside the chamber 110. In other one or more embodiments, the first support unit 140 may include a clamp for gripping the display substrate D. In other one or more embodiments, the first support unit 140 may include an adhesive chuck and/or an electrostatic chuck. In one or more embodiments, the first support unit 140 may be integrally formed with the magnetic force generator 160. In other one or more embodiments, the first support unit 140 may include a shuttle for transferring the display substrate D from a loading unit. Hereinafter, for convenience of description, a detailed description will be given mainly of a case where the first support unit 140 includes a shuttle.

The second support unit 150 may support the mask assembly 130. In one or more embodiments, because the second support unit 150 may be the same as or similar to the first support unit 140 described above, redundant descriptions thereof will not be provided below for convenience of description. Also, hereinafter, a detailed description will be given mainly of a case where the second support unit 150 includes a frame fixed inside the chamber 110, and the mask assembly 130 is mounted and supported on the frame.

The magnetic force generator 160 may be arranged in the chamber 110 to adhere the mask frame 131 to the display substrate D. In one or more embodiments, the magnetic force generator 160 may include an electromagnet.

The pressure adjuster 170 may be connected (e.g., coupled) to the chamber 110 to adjust the pressure inside the chamber 110. In one or more embodiments, the pressure adjuster 170 may include a pipe connected (e.g., coupled) to the chamber 110 and a pump arranged at the pipe.

The vision unit 180 may be arranged outside the chamber 110 or may be arranged to be partially inserted into the chamber 110. In one or more embodiments, the vision unit 180 may photograph an alignment mark of the mask assembly 130 and an alignment mark of the display substrate D.

Moreover, as for the operation of the display apparatus manufacturing apparatus 100 described above, after the display apparatus manufacturing apparatus 100 is transferred to a loading unit separately provided with the display substrate D, the loading unit may transfer the display substrate D to the display apparatus manufacturing apparatus 100.

The display apparatus manufacturing apparatus 100 may supply a deposition material to the deposition source 120 to form an organic emission layer among the intermediate layers over the display substrate D. In one or more embodiments, the deposition material may be deposited on the display substrate D through an opening portion 132a of the mask sheet 132.

Organic emission layers arranged over the display substrate D in one display apparatus manufacturing apparatus 100 may emit the same color. In one or more embodiments, when an organic emission layer that emits another color is formed over the display substrate D, the organic emission layer may be formed over the display substrate D in another display apparatus manufacturing apparatus 100. In one or more embodiments, different display apparatus manufacturing apparatuses 100 may be connected (e.g., coupled) to each other and the display substrate D may pass through the display apparatus manufacturing apparatuses 100 connected (e.g., coupled) to each other, to arrange each organic emission layer over the display substrate D.

When the above process is completed, the display substrate D may be carried to the outside through a separately provided unloading unit or may be supplied to an apparatus (or equipment) for the next operation. Thereafter, an opposite electrode, a thin film encapsulation layer, and/or the like may be formed over the display substrate D to complete the manufacturing of the display apparatus.

Thus, the display apparatus manufacturing apparatus 100 and a display apparatus manufacturing method thereof may manufacture the display apparatus having a precise deposition pattern.

Figure 2:
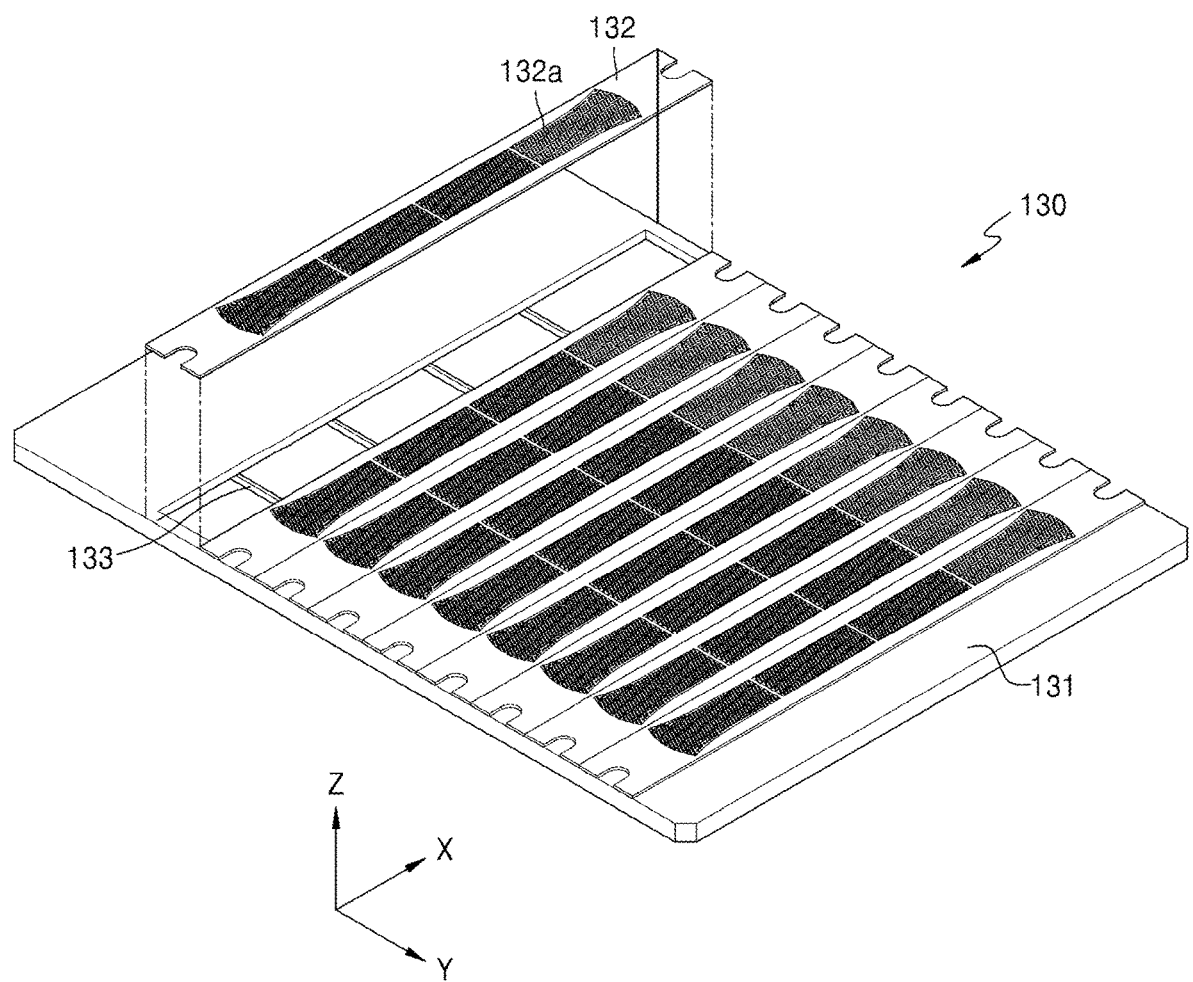
FIG. 2 is a perspective view illustrating a mask assembly illustrated in FIG. 1.
Figure 3:
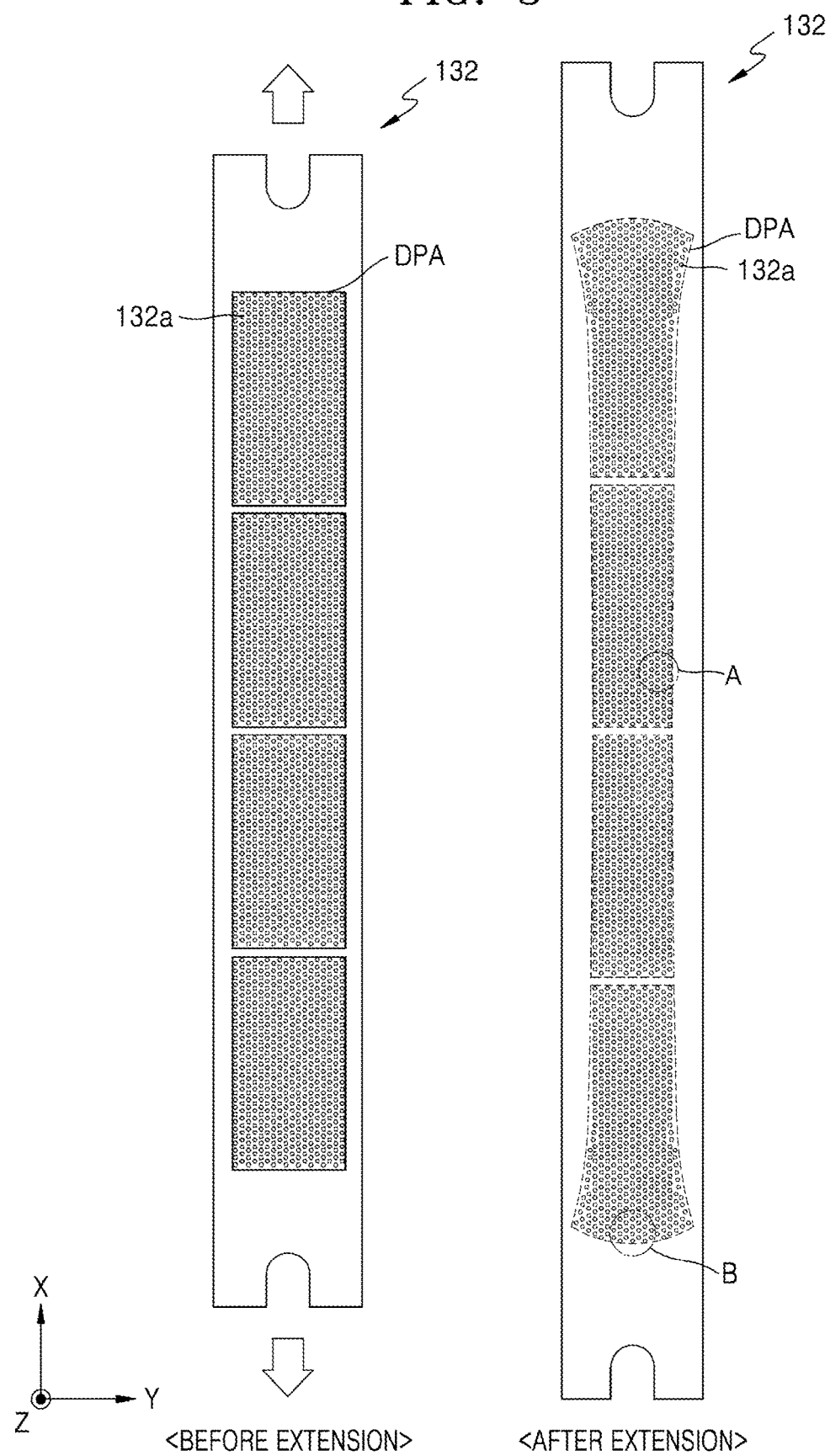
FIG. 3 is a plan view illustrating the shape of a mask sheet illustrated in FIG. 2 before and after tension.

FIG. 2 is a perspective view illustrating the mask assembly illustrated in FIG. 1. FIG. 3 is a plan view illustrating the shape of the mask sheet illustrated in FIG. 2 before and after tension.

Referring to FIGS. 2 and 3, the mask assembly 130 may include a mask frame 131, a mask sheet 132, and a support frame 133.

The mask frame 131 may have an opening portion formed at the center thereof. In one or more embodiments, the mask frame 131 may be formed in the shape of a window frame and/or the like. In other one or more embodiments, the mask frame 131 may have an opening portion formed at the center thereof, and a separate frame dividing the opening portion in a grid shape may be arranged. Hereinafter, for convenience of description, a detailed description will be given mainly of a case where the mask frame 131 has one opening portion formed at the center thereof.

The mask sheet 132 may be arranged on one surface of the mask frame 131 and fixed to the mask frame 131 through welding or the like in a state of being tensioned in at least one of a first direction and a second direction. In one or more embodiments, a groove may be formed in the mask frame 131 to accommodate the mask sheet 132. The mask sheet 132 may be formed in a rectangular shape and may be arranged on one side (e.g., one surface) of the mask frame 131. For example, the mask sheet 132 may be formed in a slit shape (e.g., in a shape of an elongated rectangle).

The mask sheet 132 described above may be provided as one mask sheet or as a plurality of mask sheets. When the mask sheet 132 is provided as one mask sheet, one mask sheet 132 may be arranged over the mask frame 131. When the mask sheet 132 is provided as a plurality of mask sheets, a plurality of mask sheets 132 may be arranged in a line to be adjacent to each other in the first direction or the second direction. For example, in one or more embodiments, the long side of the mask sheet 132 may be arranged parallel to the long side or the short side of the mask frame 131.

The mask sheet 132 may include a plurality of opening portions 132a. In one or more embodiments, the plurality of opening portions 132a may be arranged apart from each other in the first direction and the second direction. The plurality of opening portions 132a may form one group along the length direction (e.g., the extension direction) of the mask sheet 132. In one or more embodiments, the plurality of opening portions 132a forming one group may be arranged on a deposition area DPA to correspond to an opening area arranged over a display area described hereinbelow. In one mask sheet 132, the deposition area DPA may be provided as only one deposition area or as a plurality of deposition areas. Hereinafter, for convenience of description, a detailed description will be given mainly of a case where the deposition area DPA is provided as a plurality of deposition areas.

A plurality of opening portions 132a may be arranged spaced apart from each other on the deposition area DPA. In one or more embodiments, the deposition area DPA may correspond to the shape of a display area DA described hereinbelow. Hereinafter, for convenience of description, a detailed description will be given mainly of a case where the deposition area DPA has a rectangular shape.

The support frame 133 may be arranged at the mask frame 131 to not only support the mask frame 131 but also support the mask sheet 132. In one or more embodiments, the support frame 133 may be arranged at the mask frame 131 in a grid shape to define a display area of one display apparatus. For example, the support frame 133 may define a plurality of display areas by dividing a central opening portion of the mask frame 131 into a plurality of areas.

In one or more embodiments, the mask sheet 132 may be fixed to the mask frame 131 in a tensioned state. For example, an edge portion of the deposition area DPA may be deformed in at least one of the plurality of deposition areas DPA.

For example, a side edge of the deposition area DPA arranged at the center of the mask sheet 132 may be drawn into (e.g., towards the center of) the mask sheet 132 to form a curve. Here, a portion of the edge of the deposition area DPA arranged at an end portion of the mask sheet 132 may have a convex shape. When the mask sheet 132 is tensioned, the shape of the deposition area DPA may be different from the rectangular shape that is the initial shape thereof. In this case, because the position of at least one of the plurality of opening portions 132a arranged inside the deposition area DPA may be different from the initial position thereof, the path of a deposition material deposited on the display substrate D through the opening portion 132a may be different from a designed value thereof. As such, because the deposition material may not be applied to cover an entire opening area OP of a pixel definition layer 29, a defective subpixel may occur or the subpixel may fail to emit a clear light.

The mask assembly 130 according to the present embodiments may be formed differently (e.g., may be different) according to the organic emission layer arranged in each subpixel. For example, a first mask sheet 132-1 described hereinbelow may be used in the case of forming an organic emission layer that emits a first color (e.g., one of red, green, or blue, one of red, yellow, or blue, and/or the like) among a plurality of subpixels, and a second mask sheet 132-2 described herein below may be used in the case of forming an organic emission layer that emits a second color (e.g., another of red, green, and blue, another of red, yellow, and blue, and/or the like) among a plurality of subpixels. In one or more embodiments, a third mask sheet 132-3 described hereinbelow may be used in the case of forming an organic emission layer that emits a third color (e.g., another of red, green, and blue, another of red, yellow, and blue, and/or the like) among a plurality of subpixels.

Figure 4A:
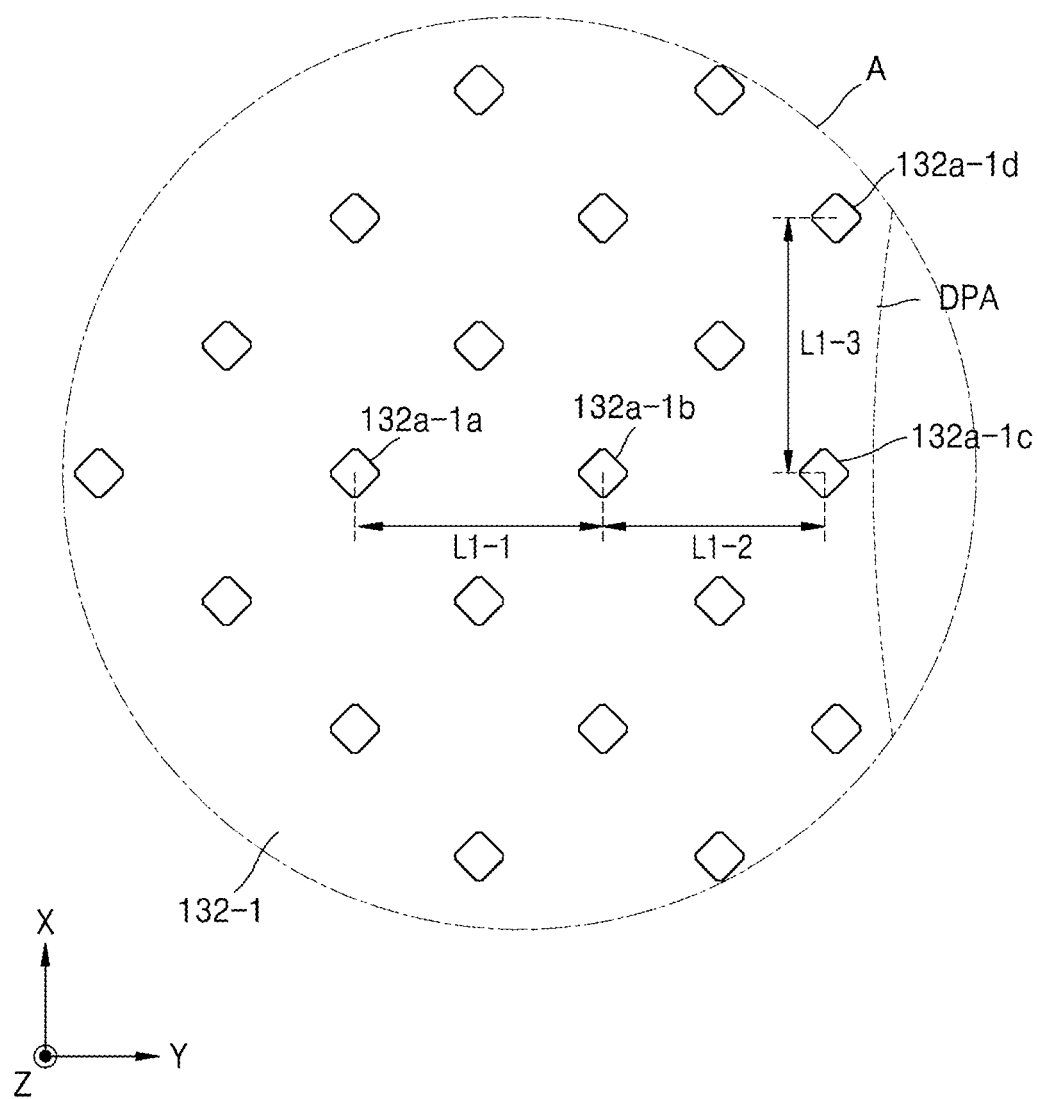
FIG. 4A is an enlarged plan view illustrating region A of a first mask sheet.
Figure 4B:
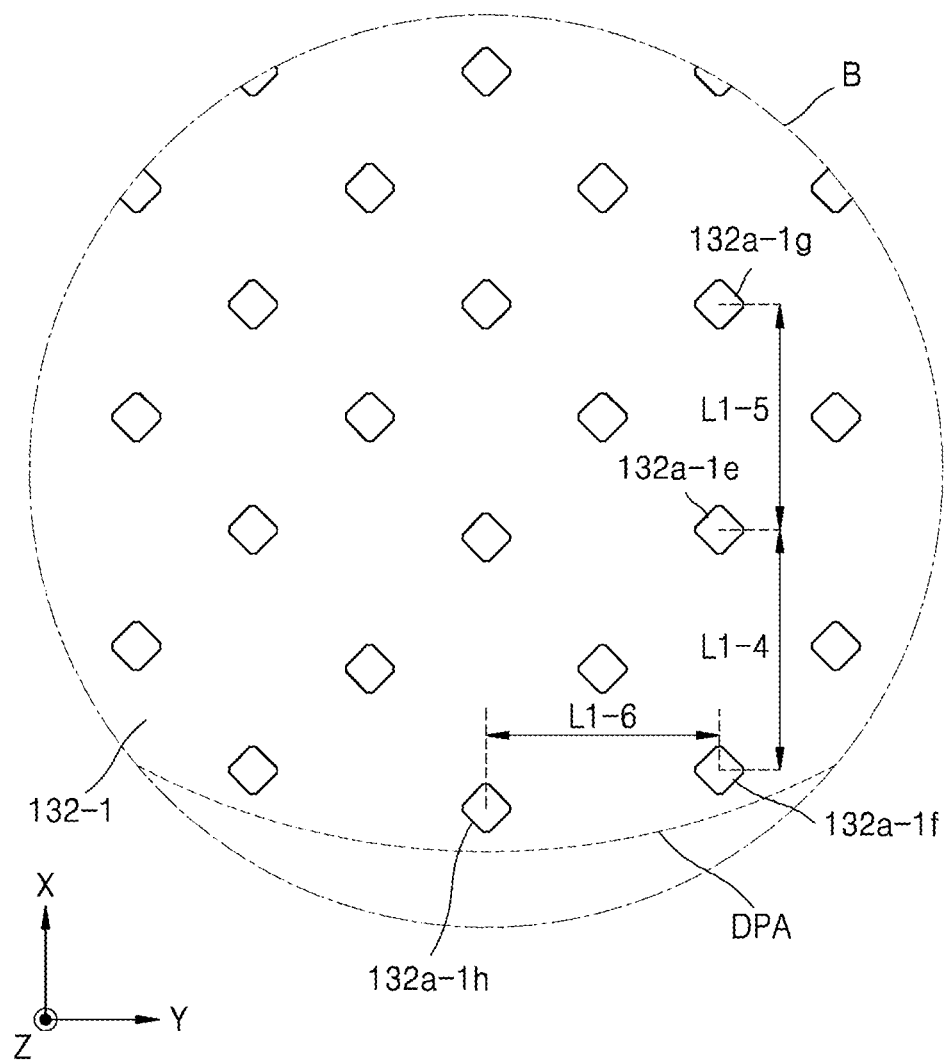
FIG. 4B is an enlarged plan view illustrating region B of the first mask sheet.

FIG. 4A is an enlarged plan view illustrating region A of a first mask sheet. FIG. 4B is an enlarged plan view illustrating region B of the first mask sheet.

Referring to FIGS. 4A and 4B, among the first opening portions of a first mask sheet 132-1 for forming an organic emission layer arranged in one of a plurality of subpixels, the position of the first opening portions arranged in region A and region B illustrated in FIG. 3 may be different from the existing (e.g., initial) position of the first opening portions. For example, when the first mask sheet 132-1 is not tensioned, the first opening portions may be arranged in a substantially straight line, and the distance between the first opening portions adjacent to each other may be maintained to be substantially uniform.

However, when the first mask sheet 132-1 is tensioned, the distances between the first opening portions adjacent in the first direction may be different from each other as illustrated in FIGS. 4A and 4B. For example, among the first opening portions arranged in region A of the first mask sheet 132-1, a (1-1)st distance L1-1 between a (1-1)st opening portion 132a-1a and a (1-2)nd opening portion 132a-1b and a (1-2)nd distance L1-2 between the (1-2)nd opening portion 132a-1b and a (1-3)rd opening portion 132a-1c may be different from each other. In one or more embodiments, the (1-1)st distance L1-1 may be greater than the (1-2)nd distance L1-2. For example, in region A of the first mask sheet 132-1, the (1-3)rd opening portion 132a-1c may move from its initial position towards the inner region of the first mask sheet 132-1 to be closer to the (1-2)nd opening portion 132a-1b than the initial position of the (1-3)rd opening portion 132a-1c. In one or more embodiments, the (1-2)nd distance L1-2 may be less than an initial value thereof (e.g., the initial (1-2)nd distance L1-2 based on the positions of the corresponding opening portions prior to the first mask sheet 132-1 being tensioned). In one or more embodiments, a (1-4)th opening portion 132a-1d may be farther from the (1-3)rd opening portion 132a-1c according to the tension of the first mask sheet 132-1 (e.g., when the first mask sheet 132-1 is tensioned). In this case, a (1-3)rd distance L1-3 therebetween may be greater than an initial value thereof.

The distances between a (1-5)th opening portion 132a-1e, a (1-6)th opening portion 132a-1f, a (1-7)th opening portion 132a-1g, and a (1-8)th opening portion 132a-1h arranged in region B of the first mask sheet 132-1 may also vary. For example, because region B of the first mask sheet 132-1 may be arranged at an end portion of the first mask sheet 132-1, a portion of the edge of the deposition area DPA may protrude toward the end portion of the first mask sheet 132-1. In this case, because the position of at least one of the (1-5)th opening portion 132a-1e, the (1-6)th opening portion 132a-1f, the (1-7)th opening portion 132a-1g, or the (1-8)th opening portion 132a-1h may vary, at least one of a (1-4)th distance L1-4, a (1-5)th distance L1-5, or a (1-6)th distance L1-6 therebetween may be different from the respective initial value(s) thereof.

According to one or more embodiments, when the position of at least one of the plurality of first opening portions is different from the initial position thereof due to the tension of the first mask sheet 132-1, the deposition material that passed through the first opening portion may not be deposited at a preset position of the display substrate D. Because the deposition material may not be deposited to completely cover (e.g., shield) the opening area of the pixel definition layer 29, the organic emission layer may be arranged only at a portion of the pixel electrode exposed through the opening area.

Figure 5A:
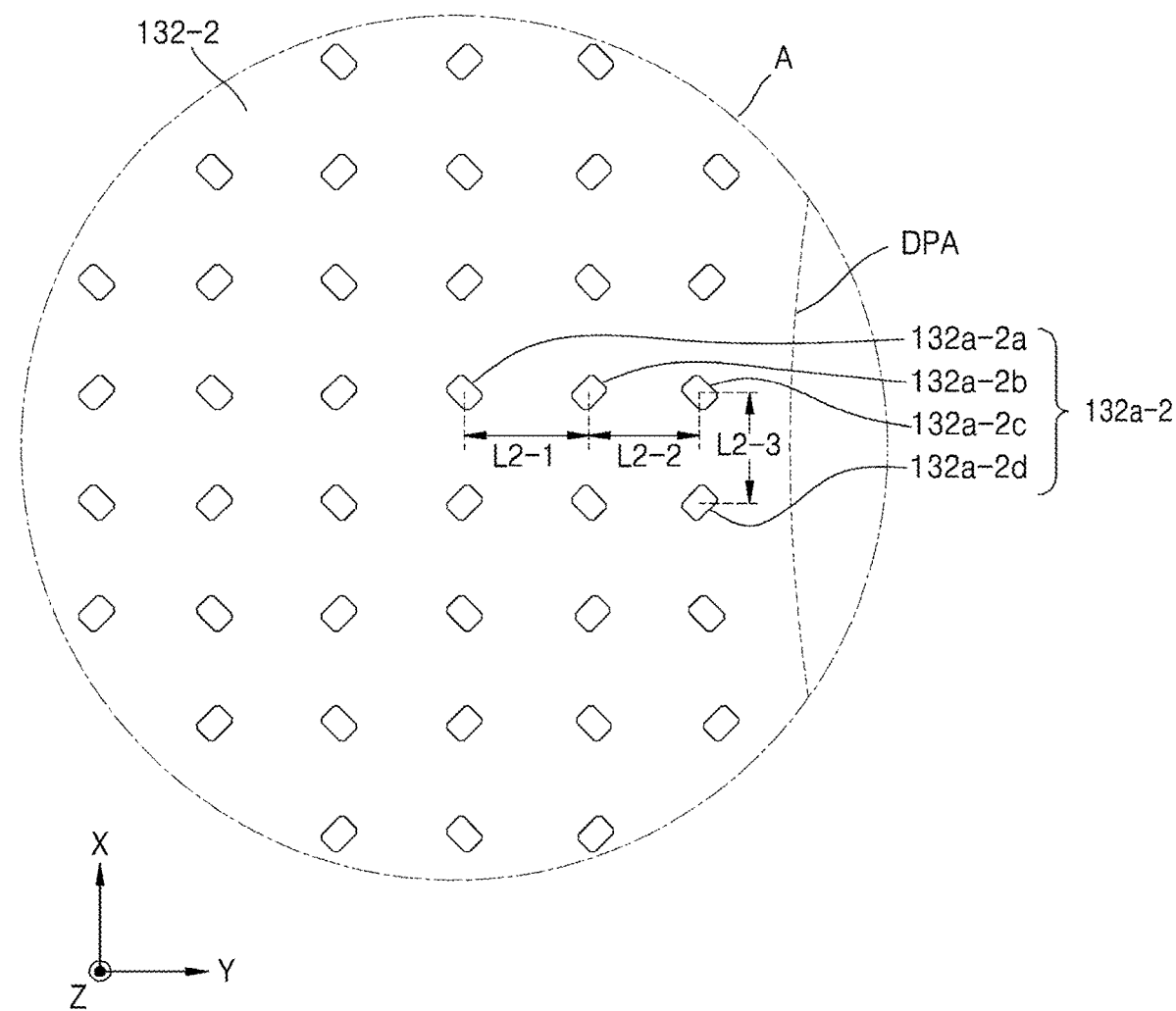
FIG. 5A is an enlarged plan view illustrating region A of a second mask sheet.
Figure 5B:
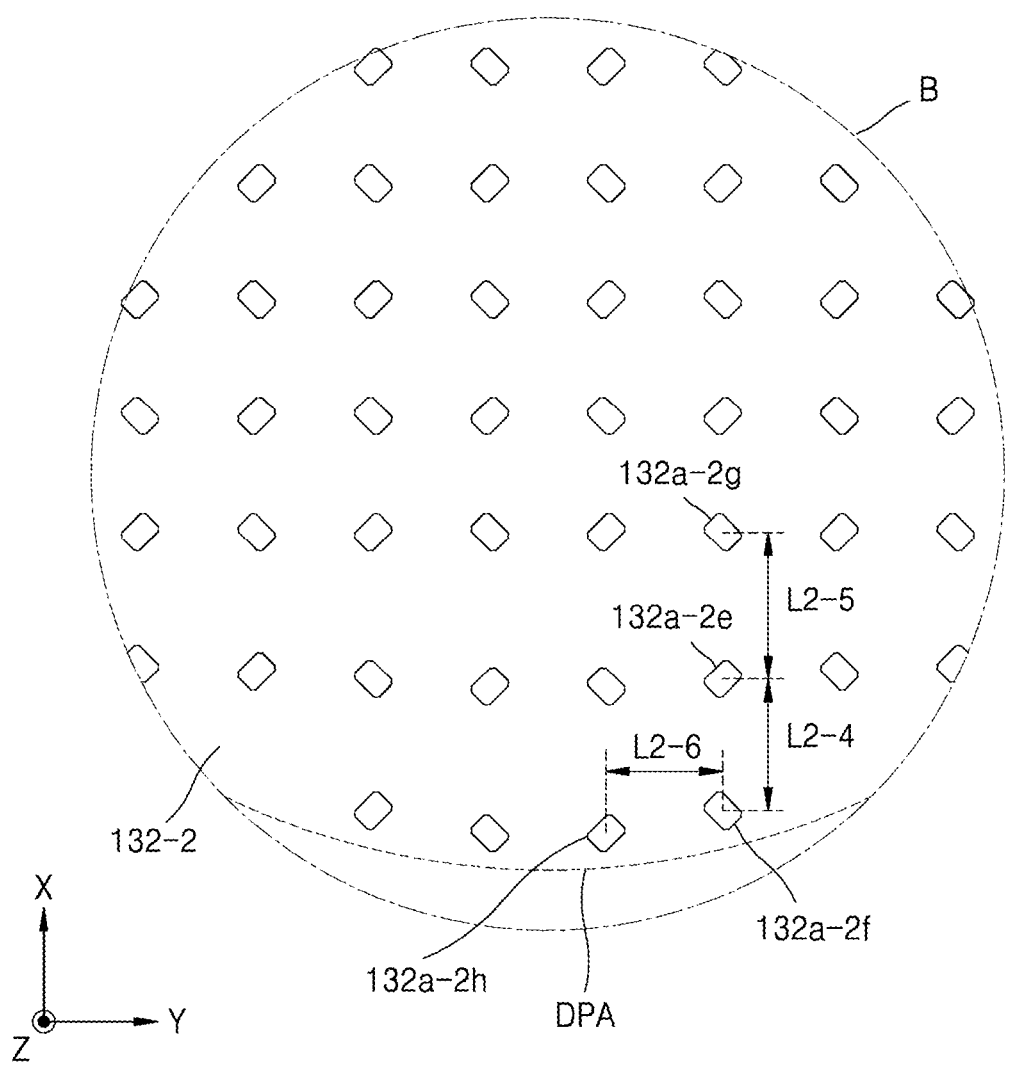
FIG. 5B is an enlarged plan view illustrating region B of the second mask sheet.

FIG. 5A is an enlarged plan view illustrating region A of a second mask sheet. FIG. 5B is an enlarged plan view illustrating region B of the second mask sheet.

Referring to FIGS. 5A and 5B, a second mask sheet 132-2 may also vary in shape similarly to the first mask sheet 132-1 illustrated in FIGS. 4A and 4B.

The position of at least one of a plurality of second opening portions 132a-2 may be different from the initial position thereof. For example, the position of at least one of a (2-1)st opening portion 132a-2a, a (2-2)nd opening portion 132a-2b, a (2-3)rd opening portion 132a-2c, a (2-4)th opening portion 132a-2d, a (2-5)th opening portion 132a-2e, a (2-6)th opening portion 132a-2f, a (2-7)th opening portion 132a-2g, and a (2-8)th opening portion 132a-2h may be different from the respective initial position(s) thereof.

In one or more embodiments, at least one of a (2-1)st distance L2-1, a (2-2)nd distance L2-2, a (2-3)rd distance L2-3, a (2-4)th distance L2-4, a (2-5)th distance L2-5, or a (2-6)th distance L2-6 between the corresponding opening portions may be less or greater than the respective initial value(s) thereof. In one or more embodiments, one of the (2-1)st distance L2-1, the (2-2)nd distance L2-2, the (2-3)rd distance L2-3, the (2-4)th distance L2-4, the (2-5)th distance L2-5, or the (2-6)th distance L2-6 may be different from another of the (2-1)st distance L2-1, the (2-2)nd distance L2-2, the (2-3)rd distance L2-3, the (2-4)th distance L2-4, the (2-5)th distance L2-5, or the (2-6)th distance L2-6.

Figure 6A:
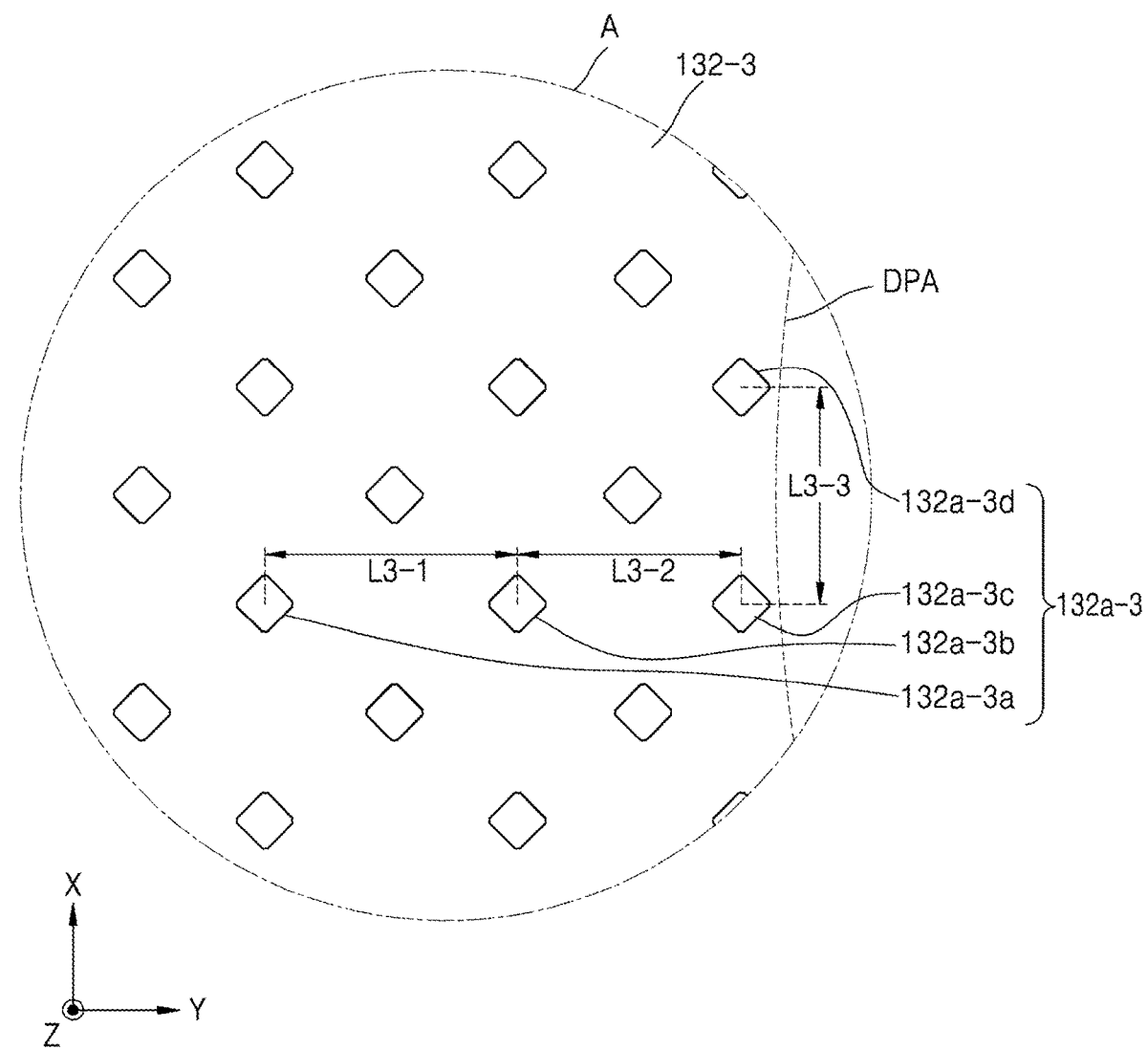
FIG. 6A is an enlarged plan view illustrating region A of a third mask sheet.
Figure 6B:
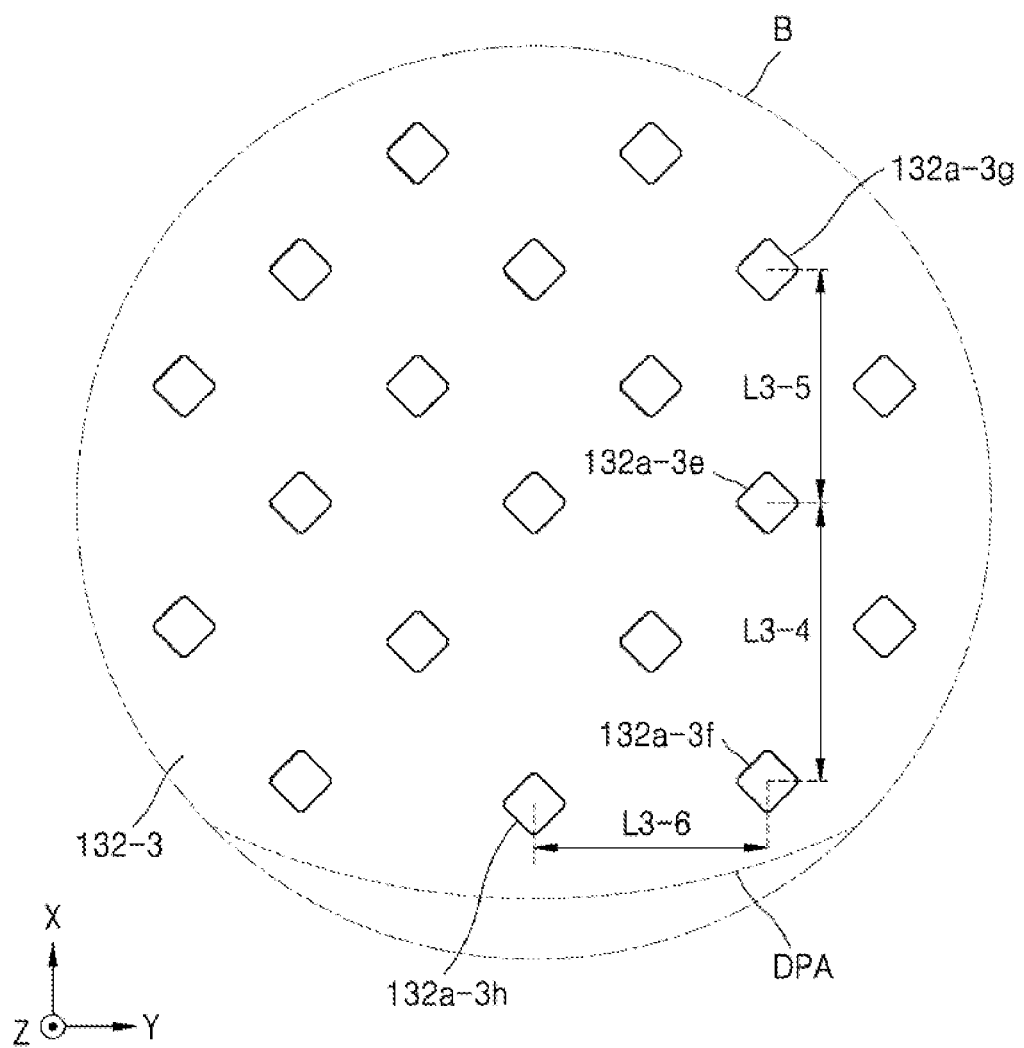
FIG. 6B is an enlarged plan view illustrating region B of the third mask sheet.

FIG. 6A is an enlarged plan view illustrating region A of a third mask sheet. FIG. 6B is an enlarged plan view illustrating region B of the third mask sheet.

Referring to FIGS. 6A and 6B, a third mask sheet 132-3 may also vary in shape similarly to the first mask sheet 132-1 illustrated in FIGS. 4A and 4B.

The position of at least one of a plurality of third opening portions 132a-3 may be different from the initial position thereof. For example, the position of at least one of a (3-1)st opening portion 132a-3a, a (3-2)nd opening portion 132a-3b, a (3-3)rd opening portion 132a-3c, a (3-4)th opening portion 132a-3d, a (3-5)th opening portion 132a-3e, a (3-6)th opening portion 132a-3f, a (3-7)th opening portion 132a-3g, or a (3-8)th opening portion 132a-3h may be different from the respective initial position(s) thereof.

In one or more embodiments, at least one of a (3-1)st distance L3-1, a (3-2)nd distance L3-2, a (3-3)rd distance L3-3, a (3-4)th distance L3-4, a (3-5)th distance L3-5, or a (3-6)th distance L3-6 between the corresponding opening portions may be less or greater than the respective initial value(s) thereof. In one or more embodiments, one of the (3-1)st distance L3-1, the (3-2)nd distance L3-2, the (3-3)rd distance L3-3, the (3-4)th distance L3-4, the (3-5)th distance L3-5, or the (3-6)th distance L3-6 may be different from another of the (3-1)st distance L3-1, the (3-2)nd distance L3-2, the (3-3)rd distance L3-3, the (3-4)th distance L3-4, the (3-5)th distance L3-5, or the (3-6)th distance L3-6.

Figure 7:
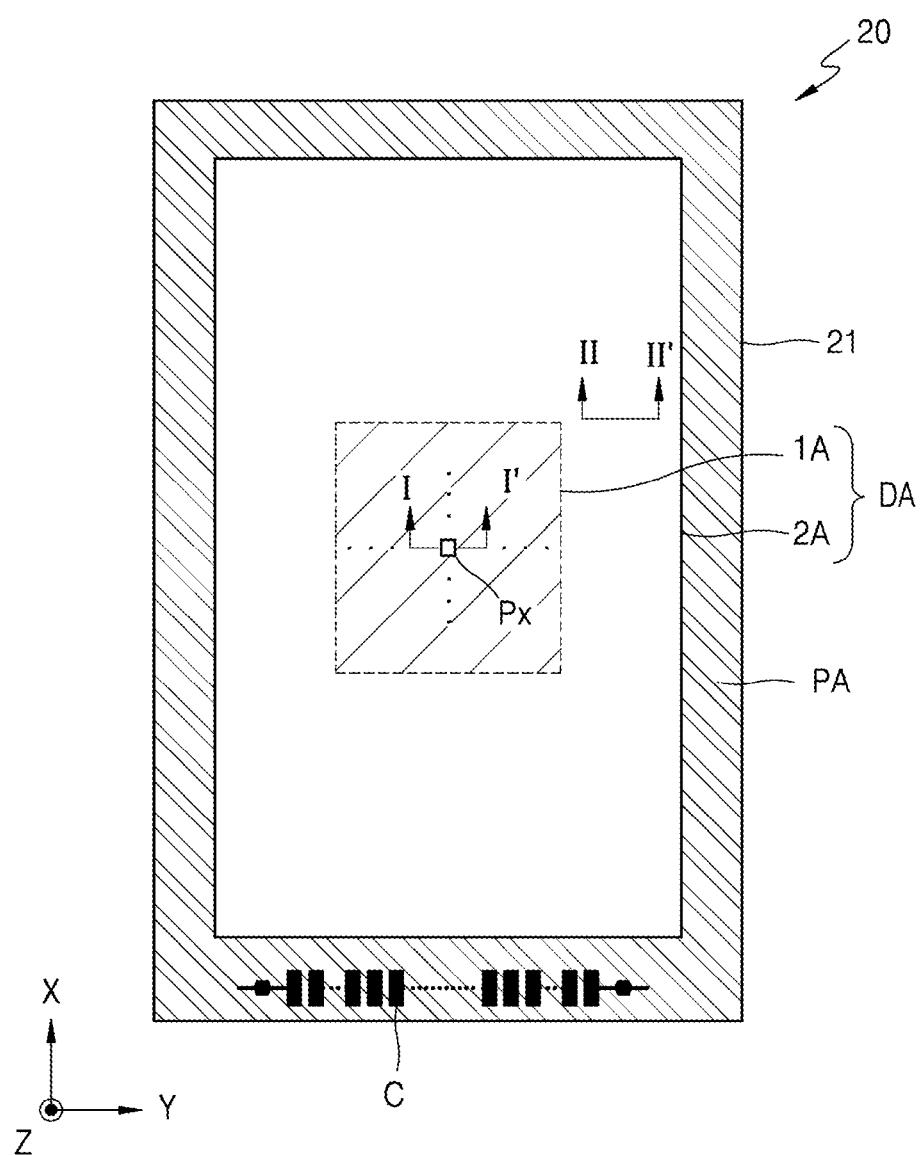
FIG. 7 is a plan view illustrating a display apparatus according to one or more embodiments.
Figure 8A:
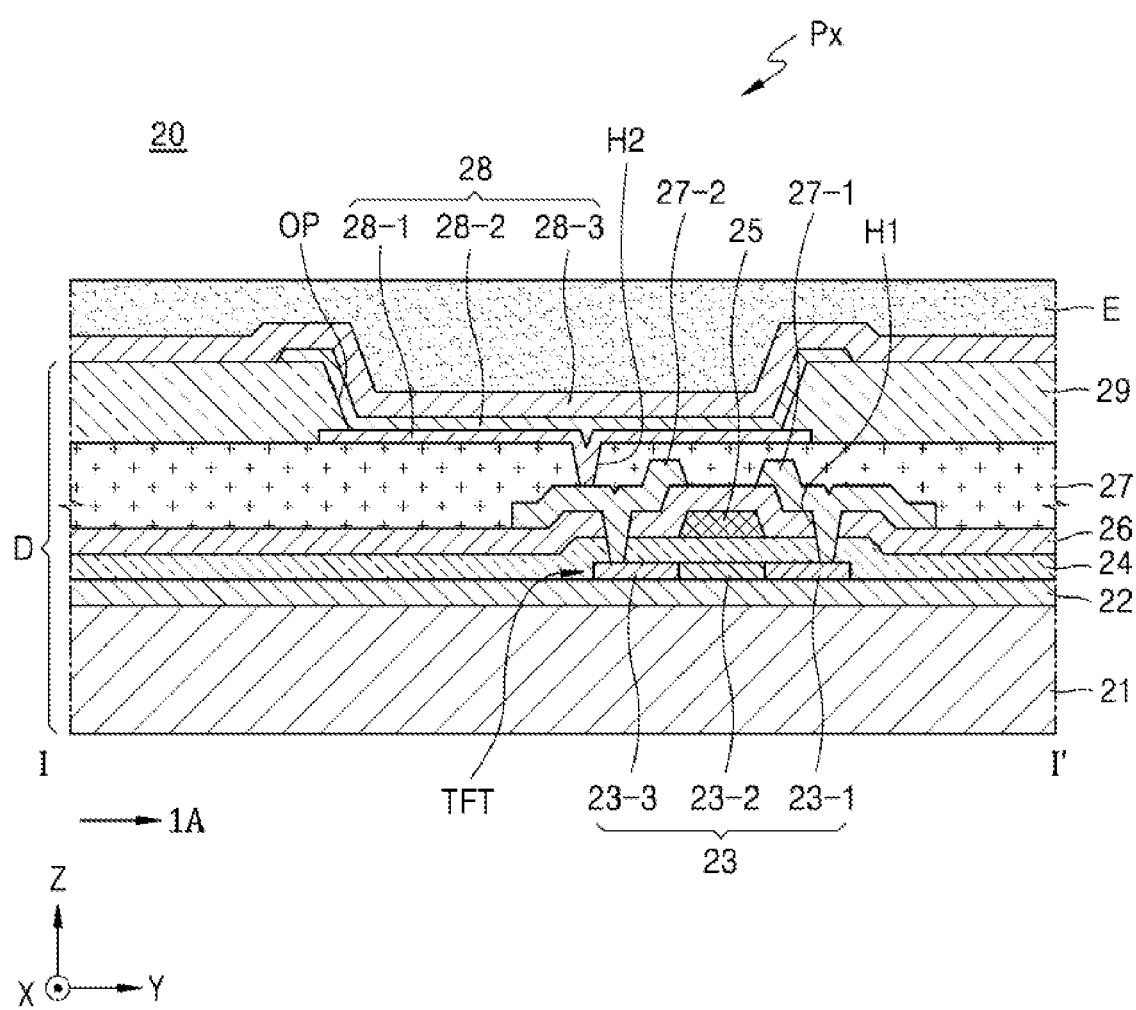
FIGS. 8A and 8B are cross-sectional views illustrating pixels respectively arranged in a first area and a second area of FIG. 7.
Figure 8B:
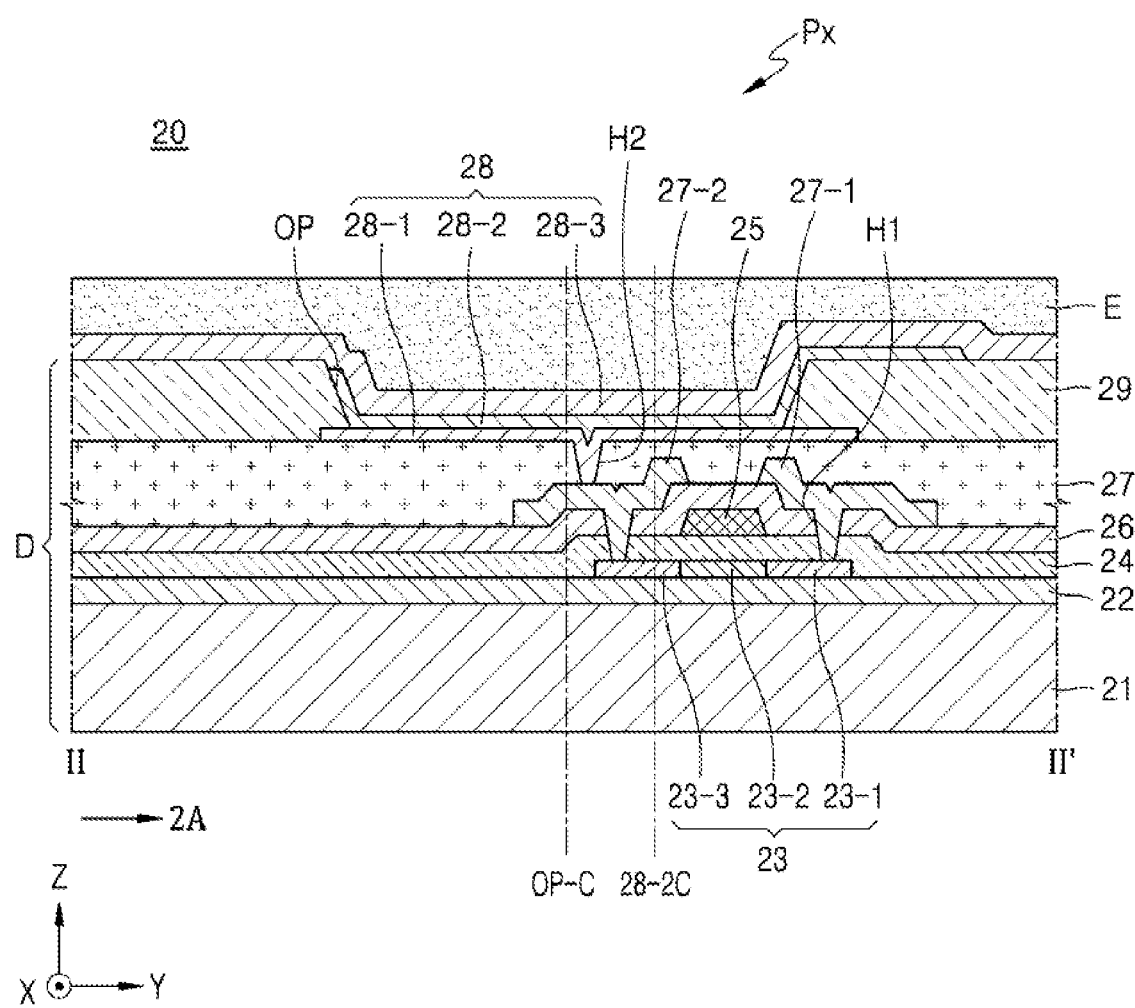

FIG. 7 is a plan view illustrating a display apparatus according to an embodiment. FIGS. 8A and 8B are cross-sectional views illustrating pixels respectively arranged in a first area and a second area of FIG. 7.

Referring to FIGS. 7 to 8B, a display apparatus 20 may be defined by a display area DA over a substrate 21 and a peripheral area PA around the display area DA. A light emitting unit may be arranged in the display area DA, and a power line and/or the like may be arranged in the peripheral area PA, which may be an area that does not emit light. In one or more embodiments, a pad unit C may be arranged in the peripheral area PA.

In one or more embodiments, the display area DA may have various suitable shapes. For example, the display area DA may have a substantially rectangular, square, or circular shape. In some embodiments, the display area DA may have atypical shapes other than the substantially rectangular, square, polygonal, or circular shape. However, hereinafter, for convenience of description, a detailed description will be given mainly of a case where the display area DA has a rectangular (or substantially rectangular) shape.

The display area DA may be divided into at least two areas. In one or more embodiments, each of the at least two areas may include at least one subpixel. For example, one of the at least two areas may include one subpixel, and the other(s) of the at least two areas may include a plurality of subpixels. In other one or more embodiments, one of the at least two areas may include some of a plurality of subpixels, and another (or the other) of the at least two areas may include the other(s) of the plurality of subpixels. As for the subpixels that are arranged in respective areas as described above and emit the same color, depending on the respective areas, the center of a pixel electrode 28-1, the center of an opening area OP, and the center of an organic emission layer of an intermediate layer 28-2, which are arranged in each subpixel and will be described hereinbelow, may be arranged to match or mismatch with each other. Hereinafter, for convenience of description, a detailed description will be given mainly of a case where the display area DA includes a first area 1A and a second area 2A, the center of the pixel electrode 28-1, the center of the opening area OP, and the center of the organic emission layer of the intermediate layer 28-2 are arranged to match with each other in the subpixel arranged in the first area 1A, and the center of the pixel electrode 28-1, the center of the opening area OP, and the center of the organic emission layer of the intermediate layer 28-2 are arranged to mismatch with each other in the subpixel arranged in the second area 2A. In one or more embodiments, as illustrated in FIG. 7, the first area 1A is located at the center of the display area DA, and the second area 2A is arranged around the first area 1A; however, the disclosure is not limited thereto, and the first area 1A and the second area 2A may be arranged at various suitable positions of the display area DA because they may be defined according to the deformation of the mask sheet 132. However, hereinafter, for convenience of description, a detailed description will be given mainly of a case where the first area 1A is located at the center of the display area DA and the second area 2A is located around the first area 1A.

The display apparatus 20 may include a display substrate D and an encapsulation member. In one or more embodiments, the display substrate D may include a substrate 21, a thin film transistor TFT, a passivation layer 27 and a pixel electrode 28-1. In other one or more embodiments, the display substrate D may include some of a substrate 21, a thin film transistor TFT, a passivation layer 27, a pixel electrode 28-1, and the intermediate layer 28-2.

The substrate 21 may include a plastic material and may include a metal material such as stainless use steel (SUS) and/or titanium (Ti). In one or more embodiments, the substrate 21 may include a polymer resin such as polyethersulfone, polyacrylate, polyetherimide, polyethylene naphthalate, polyethylene terephthalate, polyphenylene sulfide, polyarylate, polyimide, polycarbonate, and/or cellulose acetate propionate. The substrate 21 may have a single-layer or multiple-layer structure of any of the above material(s) and may further include an inorganic layer in the case of having a multiple-layer structure. Hereinafter, for convenience of description, a detailed description will be given mainly of a case where the substrate 21 includes polyimide.

A thin film transistor TFT may be formed over the substrate 21, a passivation layer 27 may be formed to cover the thin film transistor TFT, and an organic light emitting device 28 may be formed over the passivation layer 27.

A buffer layer 22 including an organic compound and/or an inorganic compound may be further formed on the upper surface of the substrate 21 and may include $SiO_x$ ($x \geq 1$) and/or $SiN_x$ ($x \geq 1$).

An active layer 23 arranged in a certain (or set) pattern may be formed over the buffer layer 22, and then the active layer 23 may be buried (e.g., covered) by a gate insulating layer 24. The active layer 23 may include a source area 23-1 and a drain area 23-3 and may further include a channel area 23-2 therebetween.

The active layer 23 may be formed to include various suitable materials. For example, the active layer 23 may include an inorganic semiconductor material such as amorphous silicon and/or crystalline silicon. As another example, the active layer 23 may include an oxide semiconductor. As another example, the active layer 23 may include an organic semiconductor material. Hereinafter, for convenience of description, a detailed description will be given mainly of a case where the active layer 23 includes amorphous silicon.

The active layer 23 may be formed by forming an amorphous silicon layer over the buffer layer 22, crystallizing the amorphous silicon layer into a polycrystalline silicon layer, and patterning the polycrystalline silicon layer. In the active layer 23, the source area 23-1 and the drain area 23-3 may be doped with impurities according to the type of a TFT, such as a driving TFT or a switching TFT.

A gate electrode 25 corresponding to the active layer 23 and an interlayer insulating layer 26 burying (e.g., covering) the gate electrode 25 may be formed on the upper surface of the gate insulating layer 24.

In one or more embodiments, a contact hole H1 may be formed in the interlayer insulating layer 26 and the gate insulating layer 24, and then a source electrode 27-1 and a drain electrode 27-2 may be formed over the interlayer insulating layer 26 to respectively contact the source area 23-1 and the drain area 23-3.

A passivation layer 27 may be formed over the thin film transistor formed according to the present embodiments, and a pixel electrode 28-1 of an organic light emitting device (OLED) 28 may be formed over the passivation layer 27. The pixel electrode 28-1 may contact the drain electrode 27-2 of the TFT through a via hole H2 formed in the passivation layer 27. The passivation layer 27 may be formed of an inorganic material and/or an organic material, as a single layer or as two or more layers, and may be formed as a planarization layer to have an upper surface that is flat (or substantially flat) regardless of the curvature of a lower layer thereunder, or may be formed to have a curvature along the curvature of a layer thereunder. In one or more embodiments, the passivation layer 27 may be formed of a transparent insulator to achieve a resonance effect.

After the pixel electrode 28-1 is formed over the passivation layer 27, a pixel definition layer 29 may be formed of an organic material and/or an inorganic material to cover the pixel electrode 28-1 and the passivation layer 27, and may be opened to expose a portion of the pixel electrode 28-1.

In one or more embodiments, an intermediate layer 28-2 and an opposite electrode 28-3 may be formed over at least the pixel electrode 28-1. In other one or more embodiments, the opposite electrode 28-3 may be formed over the entire surface of the display substrate D. For example, the opposite electrode 28-3 may be formed over the intermediate layer 28-2 and the pixel definition layer 29. Hereinafter, for convenience of description, a detailed description will be given mainly of a case where the opposite electrode 28-3 is formed over the intermediate layer 28-2 and the pixel definition layer 29.

The pixel electrode 28-1 may function as an anode electrode and the opposite electrode 28-3 may function as a cathode electrode, or the polarities of the pixel electrode 28-1 and the opposite electrode 28-3 may be reversed.

The pixel electrode 28-1 and the opposite electrode 28-3 may be insulated from each other by the intermediate layer 28-2, and light may be emitted from an organic emission layer by applying voltages of different polarities to the intermediate layer 28-2.

The intermediate layer 28-2 may include an organic emission layer. In one or more embodiments, the intermediate layer 28-2 may include an organic emission layer and may further include at least one of a hole injection layer (HIL), a hole transport layer, an electron transport layer, and an electron injection layer. The present embodiments are not limited thereto, and the intermediate layer 28-2 may include an organic emission layer and may further include various other suitable functional layers.

The intermediate layer 28-2 described above may be provided as a plurality of intermediate layers 28-2, and the plurality of intermediate layers 28-2 may form the display area DA. In one or more embodiments, the plurality of intermediate layers 28-2 may be arranged apart from each other in the display area DA. The intermediate layer 28-2 may emit various colors depending on the organic emission layer included therein. Hereinafter, for convenience of description, a detailed description will be given mainly of a case where the intermediate layer 28-2 includes an organic emission layer.

One unit pixel may include a plurality of subpixels. The plurality of subpixels may emit light of various colors. In one or more embodiments, one subpixel may be defined as an area that emits light of one color. In other one or more embodiments, one subpixel may be defined as a portion of the pixel electrode 28-1 exposed to the outside through an opening area OP of the pixel definition layer 29. In this case, adjusting the size of one subpixel may be achieved by adjusting the size of the opening area OP of the pixel definition layer 29 in the plan view in order to adjust the area of the portion of the pixel electrode 28-1 exposed to the outside. However, hereinafter, for convenience of description, a detailed description will be given mainly of a case where one subpixel is an area emitting light of one color.

The plurality of subpixels may include subpixels respectively that emit red, green, and blue light. In other one or more embodiments, the plurality of subpixels may include subpixels that emit red, green, blue, and white light. In other one or more embodiments, the plurality of subpixels may include subpixels that emit red, yellow, and blue light. However, the plurality of subpixels are not limited thereto and may include any suitable combination of subpixels that emit different colors. However, hereinafter, for convenience of description, a detailed description will be given mainly of a case where the plurality of subpixels includes subpixels that emit red, green, and blue light.

The subpixels may emit various colors depending on the organic emission layers of the intermediate layers 28-2 arranged in the subpixels.

In one or more embodiments, an encapsulation member may be arranged over the opposite electrode 28-3 to seal the organic light emitting device 28. In one or more embodiments, the encapsulation member may be formed in various suitable shapes. For example, the encapsulation member may include an encapsulation substrate facing a substrate and a sealing member arranged between the encapsulation substrate and the substrate. In other one or more embodiments, the encapsulation member may include a thin film encapsulation layer E arranged over the opposite electrode 28-3. Hereinafter, for convenience of description, a detailed description will be given mainly of a case where the encapsulation member includes a thin film encapsulation layer E.

The thin film encapsulation layer E may include a plurality of inorganic layers or may include inorganic layer(s) and organic layer(s).

The organic layer of the thin film encapsulation layer E may include a polymer and may include, for example, polyethylene terephthalate, polyethylene naphthalate, polycarbonate, polyimide, polyethylene sulfonate, polyoxymethylene, polyarylate, hexamethyldisiloxane, acrylic resin (e.g., polymethylmethacrylate and/or polyacrylic acid), or any combination thereof.

The inorganic layer of the thin film encapsulation layer E may include a single layer, or may have a stacked layer structure including a metal oxide and/or a metal nitride. For example, the inorganic layer may include any of $SiN_x$, $Al_2O_3$, $SiO_2$, and $TiO_2$.

The top layer of the thin film encapsulation layer E exposed to the outside may be formed as an inorganic layer to prevent or reduce moisture penetration into the organic light emitting device.

The thin film encapsulation layer E may include at least one sandwich structure in which at least one organic layer is inserted between at least two inorganic layers. As another example, the thin film encapsulation layer E may include at least one sandwich structure in which at least one inorganic layer is inserted between at least two organic layers. As another example, the thin film encapsulation layer E may include a sandwich structure in which at least one organic layer is inserted between at least two inorganic layers and a sandwich structure in which at least one inorganic layer is inserted between at least two organic layers.

The thin film encapsulation layer E may include a first inorganic layer, a first organic layer, and a second inorganic layer sequentially stacked from the top of the organic light emitting device OLED.

As another example, the thin film encapsulation layer E may include a first inorganic layer, a first organic layer, a second inorganic layer, a second organic layer, and a third inorganic layer sequentially stacked from the top of the organic light emitting device OLED.

As another example, the thin film encapsulation layer E may include a first inorganic layer, a first organic layer, a second inorganic layer, a second organic layer, a third inorganic layer, a third organic layer, and a fourth inorganic layer sequentially stacked from the top of the organic light emitting device OLED.

A metal halide layer including LiF may be additionally included between the organic light emitting device OLED and the first inorganic layer of the thin film encapsulation layer E. The metal halide layer may prevent or reduce damage to the organic light emitting device OLED when the first inorganic layer is formed by sputtering.

The first organic layer may have a smaller area than the second inorganic layer, and the second organic layer may have a smaller area than the third inorganic layer.

When a plurality of inorganic layers are provided as described herein, the inorganic layers may be deposited to directly contact each other in an edge area of the display apparatus 20 and the organic layers may not be exposed to the outside.

The display apparatus 20 may implement a precise (or substantially improved) image through each subpixel.

Hereinafter, an organic light emitting display apparatus will be described as an example of the display apparatus 20 according to one or more embodiments; however, the display apparatus of the disclosure is not limited thereto. In other one or more embodiments, various suitable types (or kinds) of display apparatuses such as inorganic EL displays (inorganic light emitting displays) and/or quantum dot light emitting displays may be used.

The subpixels according to the present embodiments may have different suitable shapes depending on the areas in which they are arranged. For example, as illustrated in FIG. 8A, in the case of the subpixel arranged in the first area 1A, the center of the opening area OP and the center of the organic emission layer of the intermediate layer 28-2 may match with each other. In one or more embodiments, in the first area 1A, the lengths of the end portions of the pixel electrode 28-1 (e.g., on both sides of the ends of the pixel electrode 28-1) inserted into the pixel definition layer 29 in one direction may be equal to each other.

In contrast, as illustrated in FIG. 8B, in the case of the subpixel arranged in the second area 2A, a center OP-C of the opening area OP and a center 28-2C of the organic emission layer of the intermediate layer 28-2 may not match with each other. In one or more embodiments, in the second area 2A, the lengths of the end portions of the pixel electrode 28-1 (e.g., on both sides of the ends of the pixel electrode 28-1) inserted into the pixel definition layer 29 in one direction may be different from each other. This will be described hereinbelow in more detail.

Figure 9:
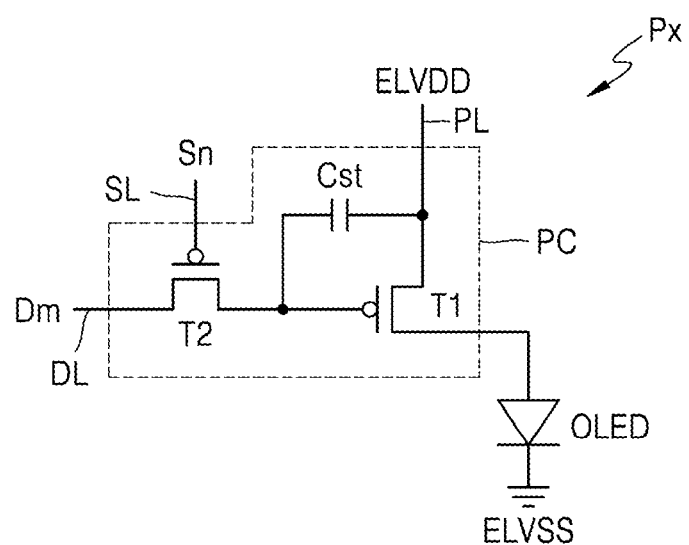
FIGS. 9 and 10 are circuit diagrams illustrating circuits of pixels illustrated in FIG. 7.
Figure 10:
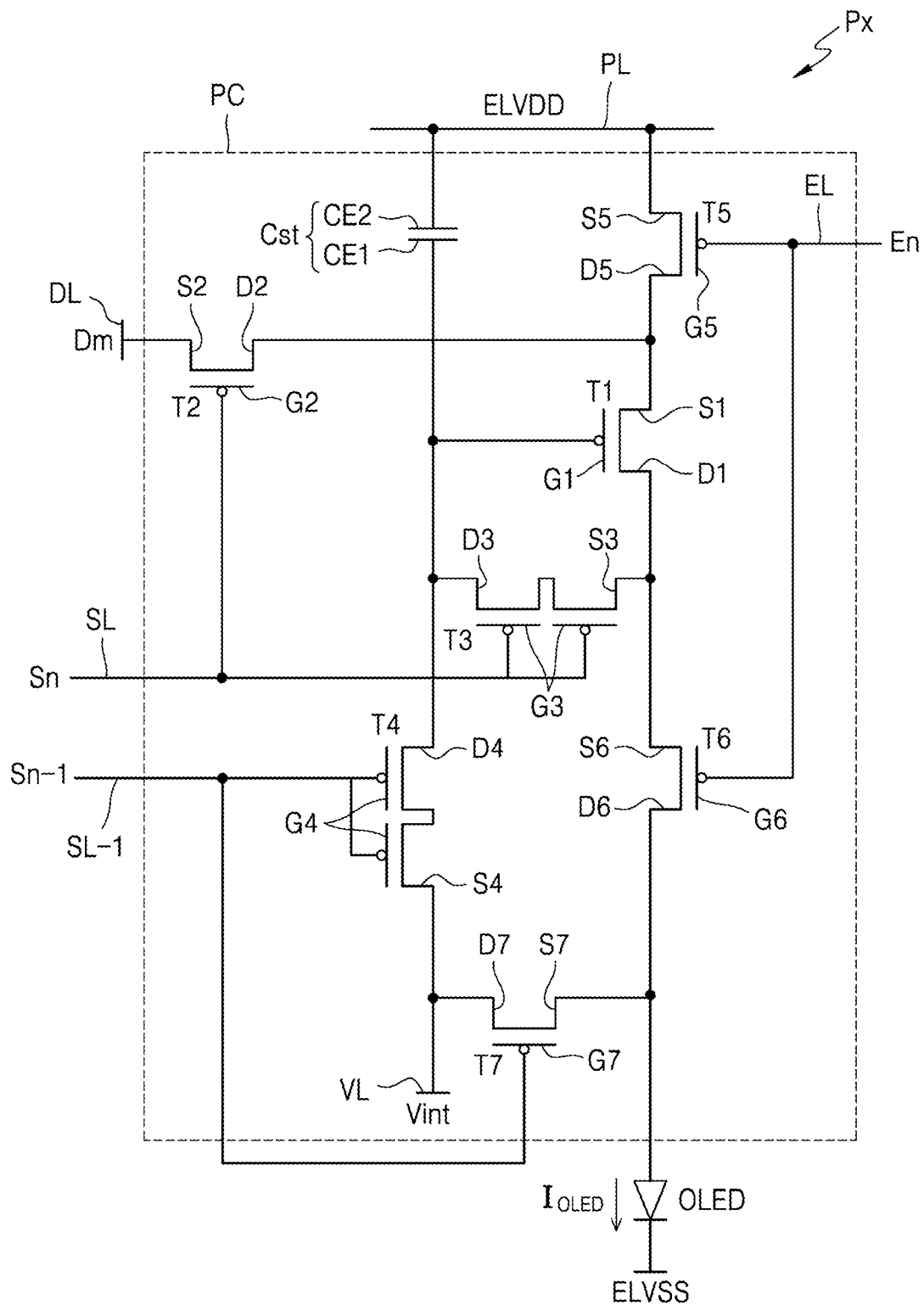

FIGS. 9 and 10 are circuit diagrams illustrating circuits of pixels illustrated in FIG. 7.

Referring to FIGS. 9 and 10, each subpixel Px may include a pixel circuit PC connected (e.g., coupled) to a scan line SL and a data line DL, and an organic light emitting device OLED connected (e.g., coupled) to the pixel circuit PC.

The pixel circuit PC may include a driving thin film transistor T1, a switching thin film transistor T2, and a storage capacitor Cst. The switching thin film transistor T2 may be connected (e.g., coupled) to the scan line SL and the data line DL and may be configured to transmit a data signal Dm input through the data line DL to the driving thin film transistor T1 according to a scan signal Sn input through the scan line SL.

The storage capacitor Cst may be connected (e.g., coupled) to the switching thin film transistor T2 and a driving voltage line PL and may store a voltage corresponding to the difference between a voltage received from the switching thin film transistor T2 and a first power voltage ELVDD (or driving voltage) supplied to the driving voltage line PL.

The driving thin film transistor T1 may be connected (e.g., coupled) to the driving voltage line PL and the storage capacitor Cst and may control a driving current flowing from the driving voltage line PL through the organic light emitting device OLED in response to a voltage value stored in the storage capacitor Cst. The organic light emitting device OLED may emit light with a certain (or set) brightness according to the driving current.

Although FIG. 9 illustrates that the pixel circuit PC includes two thin film transistors and one storage capacitor, the disclosure is not limited thereto. As illustrated in FIG. 10, the pixel circuit PC may include seven thin film transistors and one storage capacitor. Although FIG. 10 illustrates that the pixel circuit PC includes one storage capacitor, the pixel circuit PC may include two or more storage capacitors.

Referring to FIG. 10, each subpixel Px may include a pixel circuit PC and an organic light emitting device OLED connected (e.g., coupled) to the pixel circuit PC. The pixel circuit PC may include a plurality of thin film transistors and a storage capacitor. The thin film transistors and the storage capacitor may be connected (e.g., coupled) to signal lines SL, SL−1, EL, and DL, an initialization voltage line VL, and a driving voltage line PL.

Although FIG. 10 illustrates that each subpixel Px is connected (e.g., coupled) to the signal lines SL, SL−1, EL, and DL, the initialization voltage line VL, and the driving voltage line PL, the disclosure is not limited thereto. In other one or more embodiments, at least one of the signal lines SL, SL−1, EL, and DL, the initialization voltage line VL, the driving voltage line PL, and/or the like may be shared by adjacent pixels.

The signal lines may include a scan line SL configured to transmit a scan signal Sn, a previous scan line SL−1 configured to transmit a previous scan signal Sn−1 to a first initialization thin film transistor T4 and a second initialization thin film transistor T7, an emission control line EL configured to transmit an emission control signal En to an operation control thin film transistor T5 and an emission control thin film transistor T6, and a data line DL intersecting with the scan line SL and configured to transmit a data signal Dm. The driving voltage line PL may be configured to transmit a driving voltage ELVDD to a driving thin film transistor T1, and the initialization voltage line VL may be configured to transmit an initialization voltage Vint for initializing the driving thin film transistor T1 and a pixel electrode thereof.

A driving gate electrode G1 of the driving thin film transistor T1 may be connected (e.g., coupled) to a lower electrode CE1 of the storage capacitor Cst, a driving source electrode S1 of the driving thin film transistor T1 may be connected (e.g., coupled) to the driving voltage line PL via the operation control thin film transistor T5, and a driving drain electrode D1 of the driving thin film transistor T1 may be electrically connected (e.g., coupled) to the pixel electrode of the organic light emitting device OLED via the emission control thin film transistor T6. The driving thin film transistor T1 may receive the data signal Dm according to a switching operation of the switching thin film transistor T2 and supply a driving current $I_{OLED}$ to the organic light emitting device OLED.

A switching gate electrode G2 of the switching thin film transistor T2 may be connected (e.g., coupled) to the scan line SL, a switching source electrode S2 of the switching thin film transistor T2 may be connected (e.g., coupled) to the data line DL, and a switching drain electrode D2 of the switching thin film transistor T2 may be connected (e.g., coupled) to the driving source electrode S1 of the driving thin film transistor T1 and connected (e.g., coupled) to the driving voltage line PL via the operation control thin film transistor T5. The switching thin film transistor T2 may be turned on according to the scan signal Sn received through the scan line SL, to perform a switching operation of transmitting the data signal Dm transmitted to the data line DL to the driving source electrode S1 of the driving thin film transistor T1.

A compensation gate electrode G3 of the compensation thin film transistor T3 may be connected (e.g., coupled) to the scan line SL, a compensation source electrode S3 of the compensation thin film transistor T3 may be connected (e.g., coupled) to the driving drain electrode D1 of the driving thin film transistor T1 and connected (e.g., coupled) to the pixel electrode of the main organic light emitting device OLED via the emission control thin film transistor T6, and a compensation drain electrode D3 of the compensation thin film transistor T3 may be connected (e.g., coupled) to the lower electrode CE1 of the storage capacitor Cst, a first initialization drain electrode D4 of the first initialization thin film transistor T4, and the driving gate electrode G1 of the driving thin film transistor T1. The compensation thin film transistor T3 may be turned on according to the scan signal Sn received through the scan line SL, to electrically connect the driving gate electrode G1 to the driving drain electrode D1 of the driving thin film transistor T1 to diode-connect the driving thin film transistor T1.

A first initialization gate electrode G4 of the first initialization thin film transistor T4 may be connected (e.g., coupled) to the previous scan line SL−1, a first initialization source electrode S4 of the first initialization thin film transistor T4 may be connected (e.g., coupled) to a second initialization drain electrode D7 of the second initialization thin film transistor T7 and the initialization voltage line VL, and the first initialization drain electrode D4 of the first initialization thin film transistor T4 may be connected (e.g., coupled) to the lower electrode CE1 of the storage capacitor Cst, the compensation drain electrode D3 of the compensation thin film transistor T3, and the driving gate electrode G1 of the driving thin film transistor T1. The first initialization thin film transistor T4 may be turned on according to the previous scan signal Sn−1 received through the previous scan line SL−1, to perform an initialization operation of initializing the voltage of the driving gate electrode G1 of the driving thin film transistor T1 by transmitting the initialization voltage Vint to the driving gate electrode G1 of the driving thin film transistor T1.

An operation control gate electrode G5 of the operation control thin film transistor T5 may be connected (e.g., coupled) to the emission control line EL, an operation control source electrode S5 of the operation control thin film transistor T5 may be connected (e.g., coupled) to the driving voltage line PL, and an operation control drain electrode D5 of the operation control thin film transistor T5 may be connected (e.g., coupled) to the driving source electrode S1 of the driving thin film transistor T1 and the switching drain electrode D2 of the switching thin film transistor T2.

An emission control gate electrode G6 of the emission control thin film transistor T6 may be connected (e.g., coupled) to the emission control line EL, an emission control source electrode S6 of the emission control thin film transistor T6 may be connected (e.g., coupled) to the driving drain electrode D1 of the driving thin film transistor T1 and the compensation source electrode S3 of the compensation thin film transistor T3, and an emission control drain electrode D6 of the emission control thin film transistor T6 may be electrically connected (e.g., coupled) to a second initialization source electrode S7 of the second initialization thin film transistor T7 and the pixel electrode of the organic light emitting device OLED.

The operation control thin film transistor T5 and the emission control thin film transistor T6 may be simultaneously (e.g., concurrently) turned on according to the emission control signal En received through the emission control line EL, such that the driving voltage ELVDD may be transmitted to the organic light emitting device OLED and thus the driving current $I_{OLED}$ may flow through the organic light emitting device OLED.

A second initialization gate electrode G7 of the second initialization thin film transistor T7 may be connected (e.g., coupled) to the previous scan line SL−1, the second initialization source electrode S7 of the second initialization thin film transistor T7 may be connected (e.g., coupled) to the emission control drain electrode D6 of the emission control thin film transistor T6 and the pixel electrode of the organic light emitting device OLED, and the second initialization drain electrode D7 of the second initialization thin film transistor T7 may be connected (e.g., coupled) to the first initialization source electrode S4 of the first initialization thin film transistor T4 and the initialization voltage line VL. The second initialization thin film transistor T7 may be turned on according to the previous scan signal Sn−1 received through the previous scan line SL−1, to initialize the pixel electrode of the organic light emitting device OLED.

Although FIG. 10 illustrates a case where the first initialization thin film transistor T4 and the second initialization thin film transistor T7 are connected (e.g., coupled) to the previous scan line SL−1, the disclosure is not limited thereto. In other one or more embodiments, the first initialization thin film transistor T4 may be connected (e.g., coupled) to the previous scan line SL−1 to be driven according to the previous scan signal Sn−1, and the second initialization thin film transistor T7 may be connected (e.g., coupled) to a separate signal line (e.g., a subsequent scan line) to be driven according to a signal transmitted to the separate (e.g., subsequent) signal line.

An upper electrode CE2 of the storage capacitor Cst may be connected (e.g., coupled) to the driving voltage line PL, and an opposite electrode of the organic light emitting device OLED may be connected (e.g., coupled) to a common voltage ELVSS. Accordingly, the organic light emitting device OLED may receive the driving current $I_{OLED}$ from the driving thin film transistor T1 to emit light to display an image.

Figure 11:
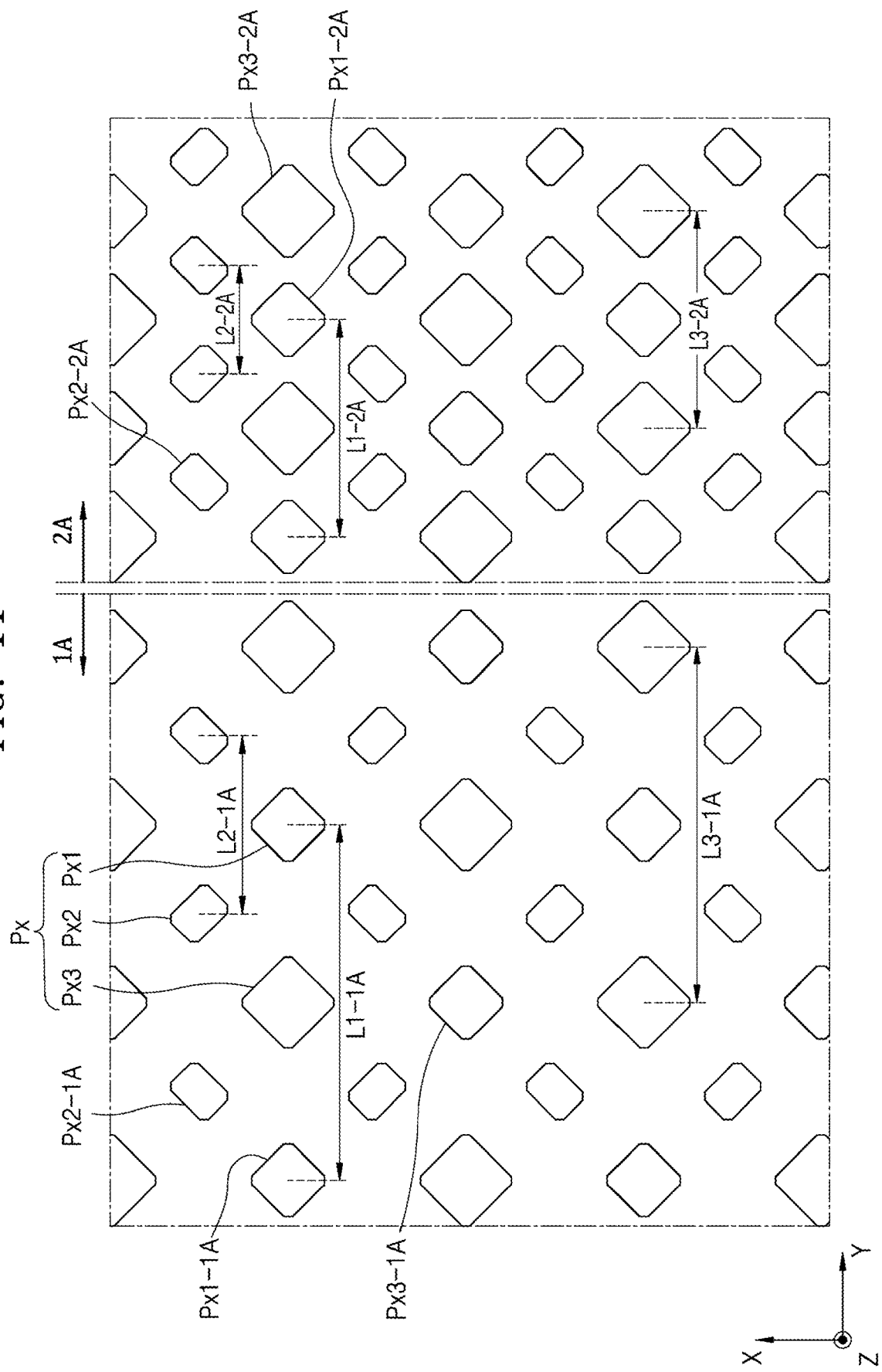
FIG. 11 is a plan view illustrating an arrangement of pixels of the display apparatus illustrated in FIG. 7.

FIG. 11 is a plan view illustrating an arrangement of pixels of the display apparatus illustrated in FIG. 7.

Referring to FIG. 11, pixels may be arranged in the display area DA. In one or more embodiments, the pixel may include a plurality of subpixels Px. The plurality of subpixels Px may include a first subpixel Px1, a second subpixel Px2, and a third subpixel Px3.

The first subpixel Px1, the second subpixel Px2, and the third subpixel Px3 described above may emit different colors. The first subpixel Px1, the second subpixel Px2, and the third subpixel Px3 may be arranged in various suitable ways. For example, all of the first subpixel Px1, the second subpixel Px2, and the third subpixel Px3 may each independently be formed in a rectangular shape and arranged in an S-stripe type (e.g., stripe pattern). In other one or more embodiments, the first subpixel Px1, the second subpixel Px2, and the third subpixel Px3 may be arranged in a PenTile®/PENTILE® form or pattern (PENTILE® is a registered trademark owned by Samsung Display Co., Ltd.) of a diamond structure as illustrated in the drawings. In one or more embodiments, the arrangement structure of the first subpixel Px1, the second subpixel Px2, and the third subpixel Px3 described above is not limited thereto and may have various forms. However, hereinafter, for convenience of description, a detailed description will be given mainly of a case where the first subpixel Px1, the second subpixel Px2, and the third subpixel Px3 are arranged in a PenTile®/PENTILE® form or pattern.

One of the first subpixel Px1, the second subpixel Px2, and the third subpixel Px3 described above may emit one of red, green, or blue colors, and another of the first subpixel Px1, the second subpixel Px2, and the third subpixel Px3 may emit another of red, green, and blue colors. In one or more embodiments, the other of the first subpixel Px1, the second subpixel Px2, and the third subpixel Px3 may emit the other of red, green, and blue colors. Hereinafter, for convenience of description, a detailed description will be given mainly of a case where the first subpixel Px1 is to emit red light, the second subpixel Px2 is to emit green light, and the third subpixel Px3 is to emit blue light.

In one or more embodiments, the first subpixel Px1 may be provided as a plurality of first subpixels Px1. For example, the distance between the centers of adjacent first subpixels Px1 among the plurality of first subpixels Px1 may not be uniform. For example, a (1-1)st subpixel distance L1-1A between (1-1)st subpixels Px1-1A, which are arranged in the first area 1A and are adjacent to each other among the plurality of first subpixels Px1, may be equal throughout all of a plurality of (1-1)st subpixels Px1-1A. For example, a (1-2)nd subpixel distance L1-2A between (1-2)nd subpixels Px1-2A, which are arranged in the second area 2A and are adjacent to each other among the plurality of first subpixels Px1, may be different from the (1-1)st subpixel distance L1-1A. For example, the (1-1)st subpixel distance L1-1A may be greater or less than the (1-2)nd subpixel distance L1-2A. For example, the (1-2)nd subpixel distance L1-2A between the (1-2)nd subpixels Px1-2A deposited through an opening portion arranged at a side surface of a mask sheet as illustrated in FIG. 3 may be less than the (1-1)st subpixel distance L1-1A between the (1-1)st subpixels Px1-1A deposited through an opening portion arranged at the center of the mask sheet. For example, the (1-2)nd subpixel distance L1-2A between the (1-2)nd subpixels Px1-2A deposited through an opening portion arranged at an upper or lower portion of a mask sheet as illustrated in FIG. 3 may be greater than the (1-1)st subpixel distance L1-1A between the (1-1)st subpixels Px1-1A deposited through an opening portion arranged at the center of the mask sheet. Hereinafter, for convenience of description, a detailed description will be given mainly of a case where the (1-1)st subpixel distance L1-1A is greater than the (1-2)nd subpixel distance L1-2A.

In one or more embodiments, the (1-2)nd subpixel distance L1-2A between a plurality of (1-2)nd subpixels Px1-2A may be different among the plurality of (1-2)nd subpixels Px1-2A. For example, the (1-2)nd subpixel distance L1-2A between the (1-2)nd subpixels Px1-2A arranged close to the peripheral area PA and adjacent to each other may be different from the (1-2)nd subpixel distance L1-2A between the (1-2)nd subpixels Px1-2A arranged close to the first area 1A and adjacent to each other. The distance between the first subpixels Px1 described above may be different depending on the position of the first opening portion after tension of the first mask sheet 132-1. For example, the position of the (1-2)nd subpixels Px1-2A, and the (1-2)nd subpixel distance L1-2A between the (1-2)nd subpixels Px1-2A, may be formed like (e.g., to correspond to) the position of the first opening portions and the distance between the first opening portions, respectively, as illustrated in FIGS. 4A and 4B. In one or more embodiments, each subpixel distance described above may refer to the distance between the centers of adjacent subpixels that are arranged in one direction and are adjacent to each other.

In one or more embodiments, each of the second subpixel Px2 and the third subpixel Px3 arranged in the display area DA may be arranged like (e.g., substantially similar to the arrangement of) the first subpixel Px1. For example, a (2-1)st subpixel distance L2-1A between the centers of (2-1)st subpixels Px2-1A arranged in the first area 1A and adjacent to each other may be different from a (2-2)nd subpixel distance L2-2A between the centers of (2-2)nd subpixels Px2-2A arranged in the second area 2A and adjacent to each other. A (3-1)st subpixel distance L3-1A between the centers of (3-1)st subpixels Px3-1A arranged in the first area 1A and adjacent to each other may be different from a (3-2)nd subpixel distance L3-2A between the centers of (3-2)nd subpixels Px3-2A arranged in the second area 2A and adjacent to each other. In one or more embodiments, the (2-2)nd subpixel distances L2-2A between the (2-2)nd subpixels Px2-2A arranged in the second area 2A may be different from each other. In one or more embodiments, the position of the (2-2)nd subpixels Px2-2A, and the (2-2)nd subpixel distance L2-2A, may be similar to the position of the second opening portions and the distance between the second opening portions, respectively, illustrated in FIGS. 5A and 5B. In one or more embodiments, the (3-2)nd subpixel distances L3-2A between the (3-2)nd subpixels Px3-2A arranged in the second area 2A may be different from each other. For example, the position of the (3-2)nd subpixels Px3-2A and the (3-2)nd subpixel distance L3-2A may be similar to the position of the third opening portions and the distance between the third opening portions, respectively, illustrated in FIGS. 6A and 6B.

In the present embodiments, as for the first subpixel Px1, the second subpixel Px2, and the third subpixel Px3 described herein, the positions of the pixel electrode, the opening area, and the organic emission layer of each subpixel may be different from each other depending on whether they are arranged in the first area 1A or the second area 2A. This will be described below in more detail.

Figure 12A:
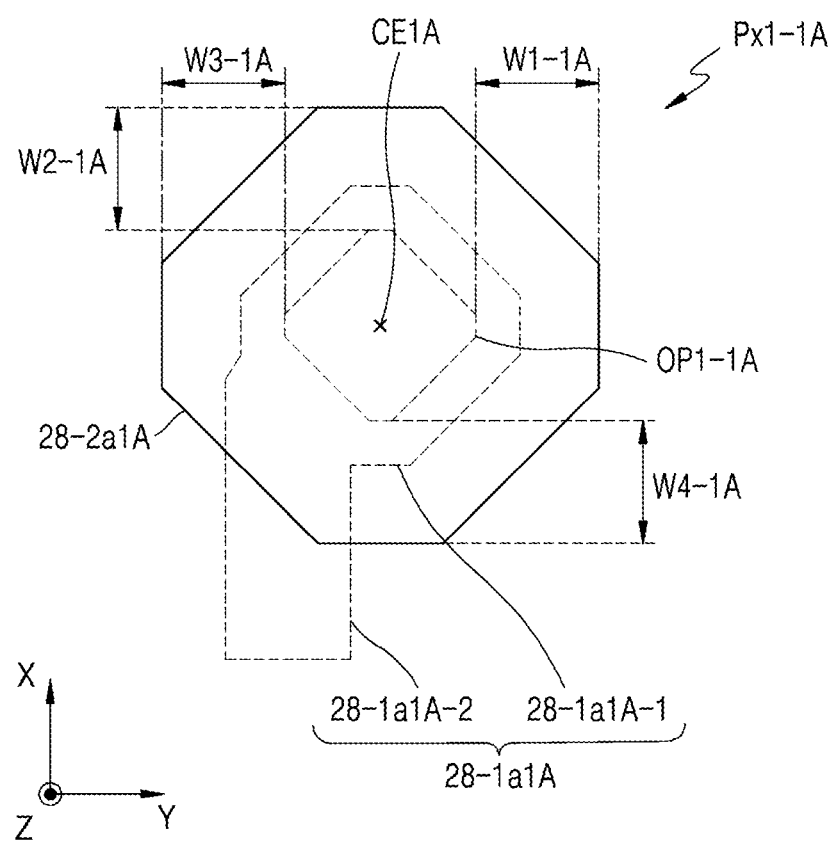
FIG. 12A is a plan view illustrating the positions of a (1-1)st pixel electrode, a (1-1)st opening area, and a (1-1)st organic emission layer of a (1-1)st subpixel of the first area illustrated in FIG. 7.

FIG. 12A is a plan view illustrating the positions of a (1-1)st pixel electrode, a (1-1)st opening area, and a (1-1)st organic emission layer of a (1-1)st subpixel of the first area illustrated in FIG. 7.

Figure 12B:
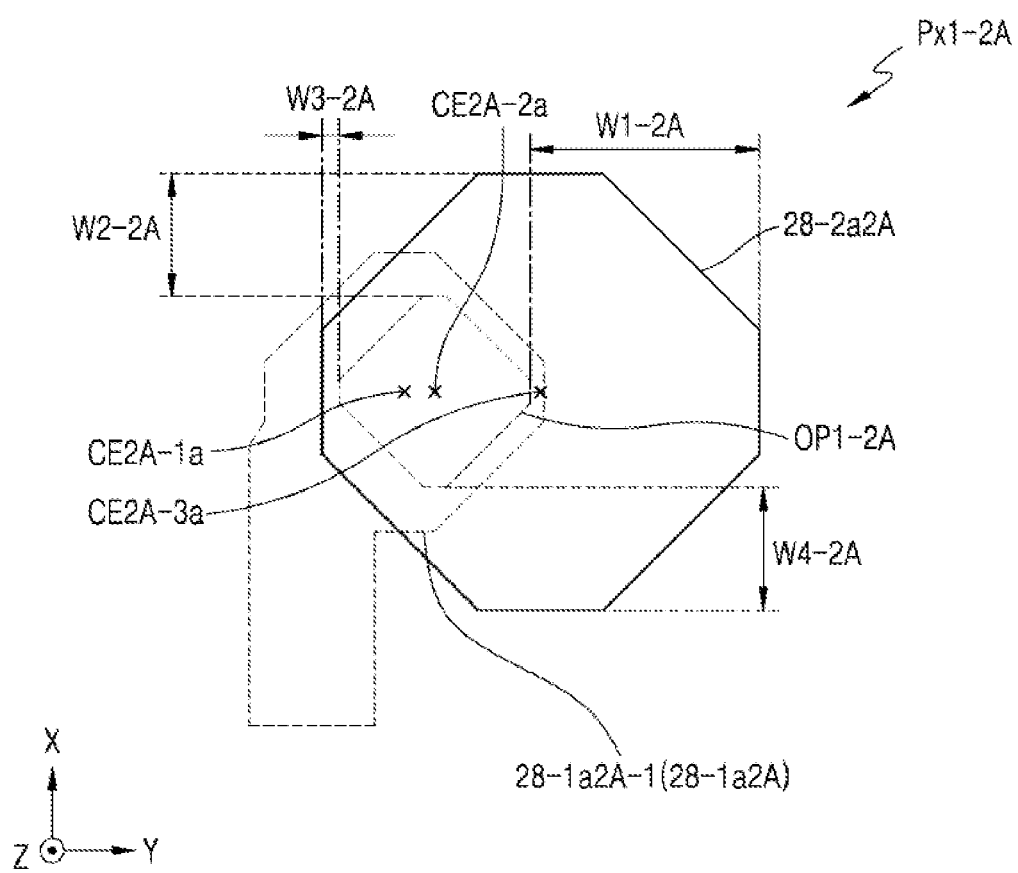
FIG. 12B is a plan view illustrating the positions of a (1-2)nd pixel electrode, a (1-2)nd opening area, and a (1-2)nd organic emission layer of a (1-2)nd subpixel of the second area illustrated in FIG. 7.

Referring to FIG. 12B, the first subpixel may include a (1-1)st subpixel Px1-1A and a (1-2)nd subpixel Px1-2A arranged in the first area 1A.

In one or more embodiments, all of a (1-1)st pixel electrode 28-1a1A, a (1-1)st opening area OP1-1A, and a (1-1)st organic emission layer 28-2a1A of the (1-1)st subpixel Px1-1A arranged in the first area 1A may have one center CE1A.

For example, the (1-1)st pixel electrode 28-1a1A may include a (1-1)st pixel electrode body 28-1a1A-1 and a (1-1)st pixel electrode connection portion 28-1a1A-2 connected (e.g., coupled) to the (1-1)st pixel electrode body 28-1a1A-1. In one or more embodiments, the (1-1)st pixel electrode connection portion 28-1a1A-2 may be connected (e.g., coupled) to a drain electrode through a contact hole. As illustrated in FIG. 12A, the (1-1)st pixel electrode connection portion 28-1a1A-2 may be formed to extend from the (1-1)st pixel electrode body 28-1a1A-1 on the same plane as the (1-1)st pixel electrode body 28-1a1A-1. In other one or more embodiments, the (1-1)st pixel electrode connection portion 28-1a1A-2 may be formed to protrude under the (1-1)st pixel electrode body 28-1a1A-1. However, hereinafter, for convenience of description, a detailed description will be given mainly of a case where the (1-1)st-pixel electrode connection portion 28-1*a*1A-2 is formed as illustrated in FIG. 12A.

In one or more embodiments, the shapes of the (1-1)st pixel electrode body 28-1*a*1A-1, the (1-1)st opening area OP1-1A, and the (1-1)st organic emission layer 28-2*a*1A may be equal or similar to each other in the plan view. In one or more embodiments, the size of the planar shape of the (1-1)st pixel electrode body 28-1*a*1A-1 and the size of the planar shape of the (1-1)st organic emission layer 28-2*a*1A may be greater than the size of the planar shape of the (1-1)st opening area OP1-1A.

The center CE1A of the planar shape of the (1-1)st pixel electrode body 28-1*a*1A-1, the center CE1A of the planar shape of the (1-1)st opening area OP1-1A, and the center CE1A of the planar shape of the (1-1)st organic emission layer 28-2*a*1A may be arranged at the same or substantially the same position.

In one or more embodiments, the intervals between the edges (e.g., periphery) of the planar shape of the (1-1)st opening area OP1-1A and the edges (e.g., periphery) of the planar shape of the (1-1)st organic emission layer 28-2*a*1A may be equal to each other. For example, a (1-1)st interval W1-1A, a (2-1)st interval W2-1A, a (3-1)st interval W3-1A, and a (4-1)st interval W4-1A illustrated in FIG. 12A may be equal to each other.

In other one or more embodiments, the distance between a (1-1)st opening area center CE1A and a (1-1)st organic emission layer center CE1A of one of the (1-1)st subpixels Px1-1A arranged in the first area 1A may be different from the distance between a (1-1)st opening area center CE1A and a (1-1)st organic emission layer center CE1A of another of the (1-1)st subpixels Px1-1A arranged in the first area 1A. For example, one of (1-1)st subpixels Px1-1A arranged in the first area 1A may be formed as illustrated in FIG. 12A, and another of the (1-2)nd subpixels Px1-2A (1-1)st may be formed as illustrated in FIG. 12B described hereinbelow.

FIG. 12B is a plan view illustrating the positions of a (1-2)nd pixel electrode, a (1-2)nd opening area, and a (1-2)nd organic emission layer of a (1-2)nd subpixel of the second area illustrated in FIG. 7.

Referring to FIG. 12B, one of a planar (1-2)nd pixel electrode body center CE2A-1*a* of a (1-2)nd pixel electrode body 28-1*a*2A-1 of the (1-2)nd subpixel Px1-2A arranged in the second area 2A, a planar (1-2)nd opening area center CE2A-2*a* of a (1-2)nd opening area OP1-2A, and a planar (1-2)nd organic emission layer center CE2A-3*a* of a (1-2)nd organic emission layer 28-2*a*2A may not match with another of the planar (1-2)nd pixel electrode body center CE2A-1*a* of the (1-2)nd pixel electrode body 28-1*a*2A-1 of the (1-2)nd subpixel Px1-2A, the planar (1-2)nd opening area center CE2A-2*a* of the (1-2)nd opening area OP1-2A, and the planar (1-2)nd organic emission layer center CE2A-3*a* of the (1-2)nd organic emission layer 28-2*a*2A. Hereinafter, for convenience of description, a detailed description will be given mainly of a case where the planar (1-2)nd pixel electrode body center CE2A-1*a* of the (1-2)nd pixel electrode body 28-1*a*2A-1 of the (1-2)nd subpixel Px1-2A, the planar (1-2)nd opening area center CE2A-2*a* of the (1-2)nd opening area OP1-2A, and the planar (1-2)nd organic emission layer center CE2A-3*a* of the (1-2)nd organic emission layer 28-2*a*2A are all different from each other.

In one or more embodiments, the (1-2)nd opening area OP1-2A may be inside the (1-2)nd organic emission layer 28-2*a*2A in the plan view. For example, the (1-2)nd opening area OP1-2A and the (1-2)nd organic emission layer 28-2*a*2A may be arranged such that the edge of the (1-2)nd organic emission layer 28-2*a*2A may completely cover the edge of the (1-2)nd opening area OP1-2A.

In one or more embodiments, the intervals between the edges (e.g., periphery) of the planar shape of the (1-2)nd opening area OP1-2A and the edges (e.g., periphery) of the planar shape of the (1-2)nd organic emission layer 28-2*a*2A may be different from each other in at least two points. For example, one of a (1-2)nd interval W1-2A, a (2-2)nd interval W2-2A, a (3-2)nd interval W3-2A, and a (4-2)nd interval W4-2A illustrated in FIG. 12B may be different from another of the (1-2)nd interval W1-2A, the (2-2)nd interval W2-2A, the (3-2)nd interval W3-2A, and the (4-2)nd interval W4-2A. Hereinafter, for convenience of description, a detailed description will be given mainly of a case where the (1-2)nd interval W1-2A, the (2-2)nd interval W2-2A, the (3-2)nd interval W3-2A, and the (4-2)nd interval W4-2A are all different from each other.

In one or more embodiments, the distance between a (1-2)nd opening area center CE2A-2*a* and a (1-2)nd organic emission layer center CE2A-3*a* of one of the (1-2)nd subpixels Px1-2A arranged in the second area 2A may be different from the distance between a (1-2)nd opening area center CE2A-2*a* and a (1-2)nd organic emission layer center CE2A-3*a* of another of the (1-2)nd subpixels Px1-2A arranged in the second area 2A.

For example, one of (1-2)nd subpixels Px1-2A arranged in the second area 2A may be formed as illustrated in FIG. 12A, and another of the (1-2)nd subpixels Px1-2A may be formed as illustrated in FIG. 12B. In other one or more embodiments, all of the (1-2)nd subpixels Px1-2A arranged in the second area 2A may be formed as illustrated in FIG. 12B. For example, in all the (1-2)nd subpixels Px1-2A, the position of each center may be different from the position of each center illustrated in FIG. 12B. In other one or more embodiments, all of the (1-2)nd subpixels Px1-2A arranged in the second area 2A may be formed as illustrated in FIG. 12B, and the position of each center may be the same as the position of each center illustrated in FIG. 12B in some of a plurality of (1-2)nd subpixels Px1-2A and may be different from the position of each center illustrated in FIG. 12B in some others of the plurality of (1-2)nd subpixels Px1-2A.

For example, the distance between the first opening area center and the first organic emission layer center in one of the plurality of first subpixels Px1 may be different from the distance between the first opening area center and the first organic emission layer center in another of the plurality of first subpixels Px1.

Figure 13A:
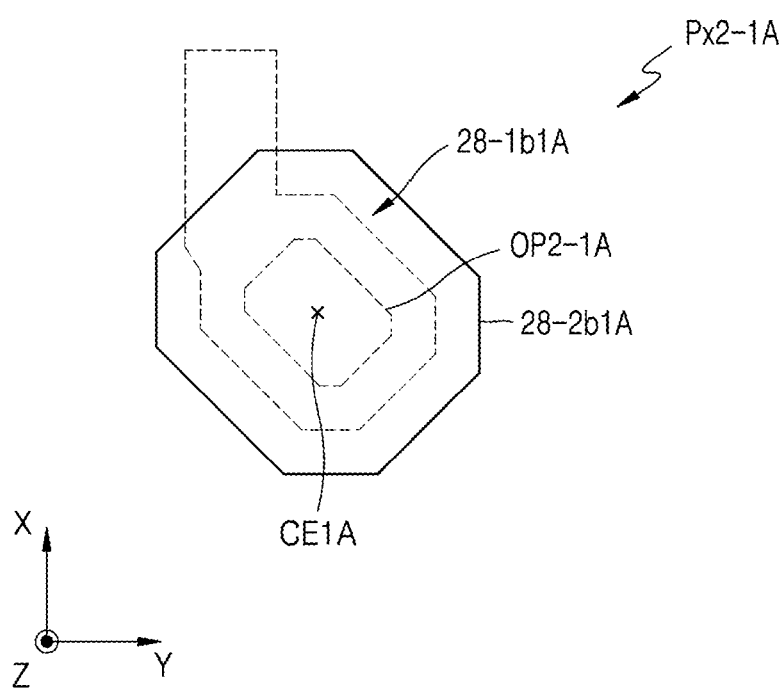
FIG. 13A is a plan view illustrating the positions of a (2-1)st pixel electrode, a (2-1)st opening area, and a (2-1)st organic emission layer of a (2-1)st subpixel of the first area illustrated in FIG. 7.

FIG. 13A is a plan view illustrating the positions of a (2-1)st pixel electrode, a (2-1)st opening area, and a (2-1)st organic emission layer of a (2-1)st subpixel of the first area illustrated in FIG. 7.

Figure 13B:
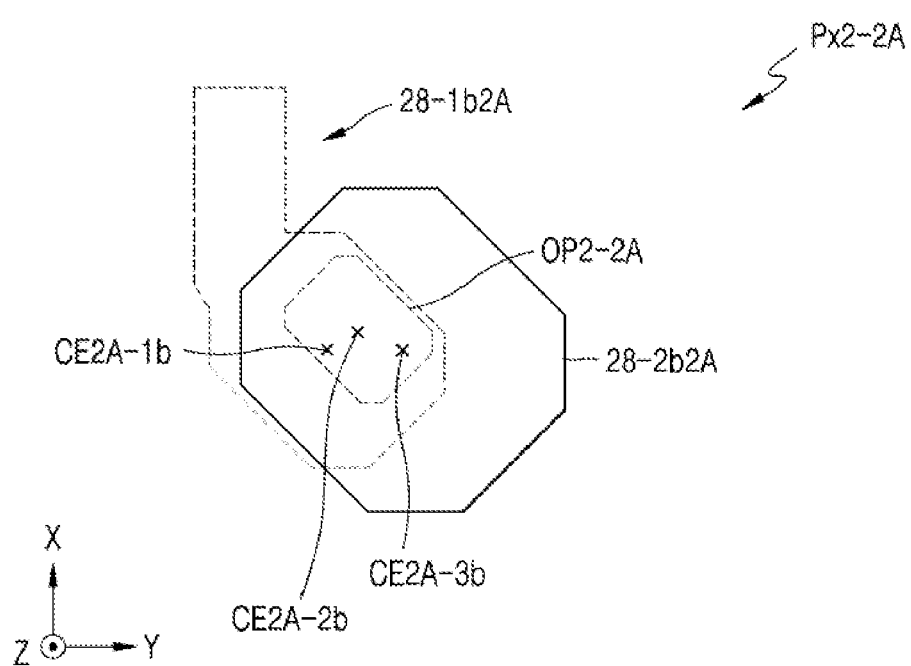
FIG. 13B is a plan view illustrating the positions of a (2-2)nd pixel electrode, a (2-2)nd opening area, and a (2-2)nd organic emission layer of a (2-2)nd subpixel of the second area illustrated in FIG. 7.

Referring to FIG. 13B, a second subpixel may include a (2-1)st subpixel Px2-1A and a (2-2)nd subpixel Px2-2A arranged in the first area 1A.

In one or more embodiments, the centers CE1A of the planar shapes of a (2-1)st pixel electrode 28-1*b*1A, a (2-1)st opening area OP2-1A, and a (2-1)st organic emission layer 28-2*b*1A of the (2-1)st subpixel Px2-1A may match with each other or may be substantially the same as each other. For example, the (2-1)st opening area OP2-1A may be arranged inside the (2-1)st organic emission layer 28-2*b*1A in the plan view. The interval from the edge of the (2-1)st opening area OP2-1A to the edge of the (2-1)st organic emission layer 28-2*b*1A may be uniform along the edge (e.g., along the periphery) of the (2-1)st opening area OP2-1A in the plan view.

In one or more other embodiments, the distance between the center CE1A of the (2-1)st opening area OP2-1A and the center CE1A of the (2-1)st organic emission layer 28-2b1A in one of the (2-1)st subpixels Px2-1A arranged in the first area 1A may be different from the distance between the center CE1A of the (2-1)st opening area OP2-1A and the center CE1A of the (2-1)st organic emission layer 28-2b1A in another of the (2-1)st subpixels Px2-1A arranged in the first area 1A. For example, one of (2-1)st subpixels Px2-1A arranged in the first area 1A may be formed as illustrated in FIG. 13A, and another of the (2-2)nd subpixels Px2-2A may be formed as illustrated in FIG. 13B described hereinbelow.

FIG. 13B is a plan view illustrating the positions of a (2-2)nd pixel electrode, a (2-2)nd opening area, and a (2-2)nd organic emission layer of a (2-2)nd subpixel of the second area illustrated in FIG. 7.

Referring to FIG. 13B, one of a (2-2)nd pixel electrode body center CE2A-1b of a (2-2)nd pixel electrode 28-1b2A of the (2-2)nd subpixel Px2-2A, a (2-2)nd opening area center CE2A-2b of a (2-2)nd opening area OP2-2A, and a (2-2)nd organic emission layer center CE2A-3b of a (2-2)nd organic emission layer 28-2b2A may be arranged at a different position than another of the (2-2)nd pixel electrode body center CE2A-1b, the (2-2)nd opening area center CE2A-2b, and the (2-2)nd organic emission layer center CE2A-3b. In one or more embodiments, the (2-2)nd opening area OP2-2A may be arranged to be completely included inside the (2-2)nd organic emission layer 28-2b2A.

For example, one of (2-2)nd subpixels Px2-2A arranged in the second area 2A may be formed as illustrated in FIG. 13A, and another of the (2-2)nd subpixels Px2-2A may be formed as illustrated in FIG. 13B. In other one or more embodiments, all of the (2-2)nd subpixels Px2-2A arranged in the second area 2A may be formed as illustrated in FIG. 13B. In one or more embodiments, in all the (2-2)nd subpixels Px2-2A, the position of each center may be different from the position of each center illustrated in FIG. 13B. In other one or more embodiments, all of the (2-2)nd subpixels Px2-2A arranged in the second area 2A may be formed as illustrated in FIG. 13B, and the position of each center may be the same as the position of each center illustrated in FIG. 13B in some of a plurality of (2-2)nd subpixels Px2-2A, and may be different from the position of each center illustrated in FIG. 13B in some others of the plurality of (2-2)nd subpixels Px2-2A.

In one or more embodiments, the (2-2)nd opening area OP2-2A may be arranged inside the (2-2)nd organic emission layer 28-2b2A in the plan view.

For example, the distance between the second opening area center and the second organic emission layer center in one of the plurality of second subpixels Px2 may be different from the distance between the second opening area center and the second organic emission layer center in another of the plurality of second subpixels Px2.

Figure 14A:
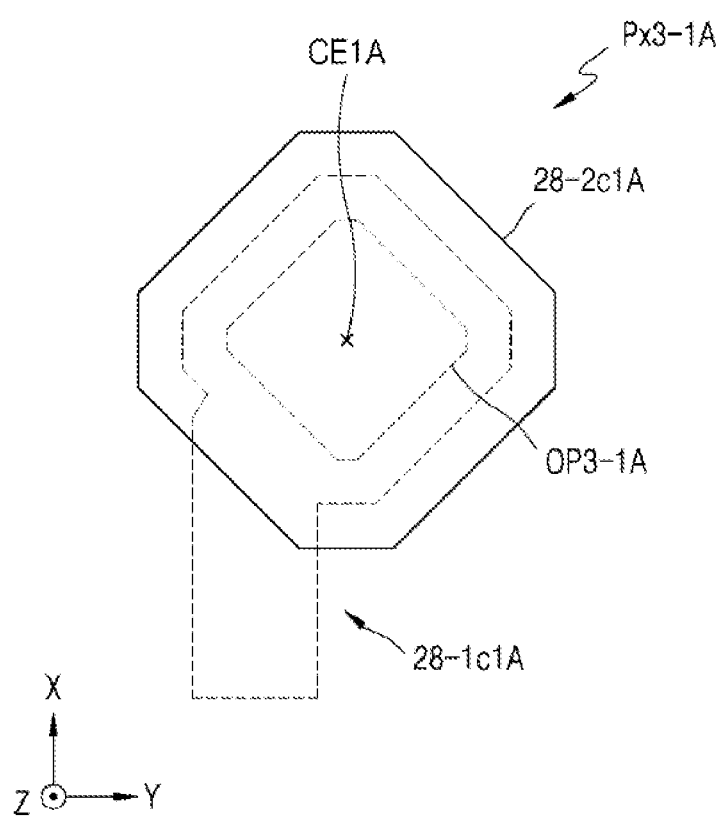
FIG. 14A is a plan view illustrating the positions of a (3-1)st pixel electrode, a (3-1)st opening area, and a (3-1)st organic emission layer of a (3-1)st subpixel of the first area illustrated in FIG. 7.

FIG. 14A is a plan view illustrating the positions of a (3-1)st pixel electrode, a (3-1)st opening area, and a (3-1)st organic emission layer of a (3-1)st subpixel of the first area illustrated in FIG. 7.

Figure 14B:
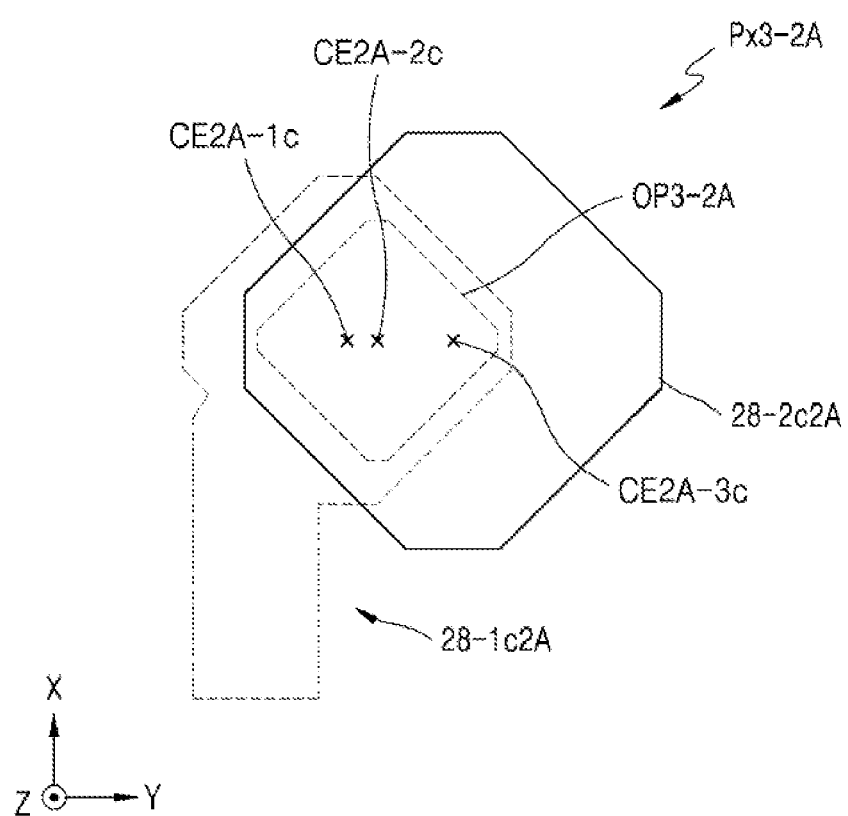
FIG. 14B is a plan view illustrating the positions of a (3-2)nd pixel electrode, a (3-2)nd opening area, and a (3-2)nd organic emission layer of a (3-2)nd subpixel of the second area illustrated in FIG. 7.

Referring to FIG. 14B, the third subpixel Px3 may include a (3-1)st subpixel Px3-1A and a (3-2)nd subpixel Px3-2A arranged in the first area 1A.

In one or more embodiments, the centers CE1A of the planar shapes of a (3-1)st pixel electrode 28-1c1A, a (3-1)st opening area OP3-1A, and a (3-1)st organic emission layer 28-2c1A of the (3-1)st subpixel Px3-1A may match with each other or may be substantially the same as each other. In one or more embodiments, the (3-1)st opening area OP3-1A may be arranged inside the (3-1)st organic emission layer 28-2c1A in the plan view. In one or more embodiments, the interval from the edge (e.g., periphery) of the (3-1)st opening area OP3-1A to the edge (e.g., periphery) of the (3-1)st organic emission layer 28-2c1A may be uniform along the edge of the (3-1)st opening area OP3-1A in the plan view.

In other one or more embodiments, the distance between the center of the (3-1)st opening area OP3-1A and the center of the (3-1)st organic emission layer 28-2c1A in one of the (3-1)st subpixels Px3-1A arranged in the first area 1A may be different from the distance between the center of the (3-1)st opening area OP3-1A and the center of the (3-1)st organic emission layer 28-2c1A in another of the (3-1)st subpixels Px3-1A arranged in the first area 1A. For example, one of (3-1)st subpixels Px3-1A arranged in the first area 1A may be formed as illustrated in FIG. 14A, and another of the (3-2)nd subpixels Px3-2A may be formed as illustrated in FIG. 14B described hereinbelow.

FIG. 14B is a plan view illustrating the positions of a (3-2)nd pixel electrode, a (3-2)nd opening area, and a (3-2)nd organic emission layer of a (3-2)nd subpixel of the second area illustrated in FIG. 7.

Referring to FIG. 14B, one of a (3-2)nd pixel electrode body center CE2A-1c of a (3-2)nd pixel electrode 28-1c2A of the (3-2)nd subpixel Px3-2A, a (3-2)nd opening area center CE2A-2c of a (3-2)nd opening area OP3-2A, and a (3-2)nd organic emission layer center CE2A-3c of a (3-2)nd organic emission layer 28-2c2A may be arranged at a different position than another of the (3-2)nd pixel electrode body center CE2A-1c, the (3-2)nd opening area center CE2A-2c, and the (3-2)nd organic emission layer center CE2A-3c. In one or more embodiments, the (3-2)nd opening area OP3-2A may be arranged to be completely (e.g., entirely) included inside the (3-2)nd organic emission layer 28-2c2A.

For example, one of (3-2)nd subpixels Px3-2A arranged in the second area 2A may be formed as illustrated in FIG. 14A, and another of the (3-2)nd subpixels Px3-2A may be formed as illustrated in FIG. 14B. In other one or more embodiments, all of the (3-2)nd subpixels Px3-2A arranged in the second area 2A may be formed as illustrated in FIG. 14B. In one or more embodiments, in all the (3-2)nd subpixels Px3-2A, the position of each center may be different from the position of each center illustrated in FIG. 14B. In other one or more embodiments, all of the (3-2)nd subpixels Px3-2A arranged in the second area 2A may be formed as illustrated in FIG. 14B, and the position of each center may be the same as the position of each center illustrated in FIG. 14B in some of a plurality of (3-2)nd subpixels Px3-2A, and may be different from the position of each center illustrated in FIG. 14B in some others of the plurality of (3-2)nd subpixels Px3-2A.

In one or more embodiments, the (3-2)nd opening area OP3-2A may be arranged inside the (3-2)nd organic emission layer 28-2c2A in the plan view.

For example the distance between the third opening area center and the third organic emission layer center in one of the plurality of third subpixels Px3 may be different from the distance between the third opening area center and the third organic emission layer center in another of the plurality of third subpixels Px3.

FIGS. 15A to 15M are cross-sectional views or plan views illustrating a display apparatus manufacturing method according to one or more embodiments.

Referring to FIGS. 15A to 15M, an organic emission layer may be formed over a display substrate D. In one or more embodiments, the mask assembly 130 illustrated in FIG. 2 may be used to form the organic emission layer. In one or more embodiments, different mask assemblies may be used depending on the light emitted from each subpixel. In one or more embodiments, because the organic emission layer formed in each subpixel portion is formed by a similar (or substantially similar) method, hereinafter, for convenience of description, a detailed description will be given mainly of a case where a (1-2)nd organic emission layer 28-2a2A shown in FIG. 12B is formed over a display substrate.

Figure 15A:
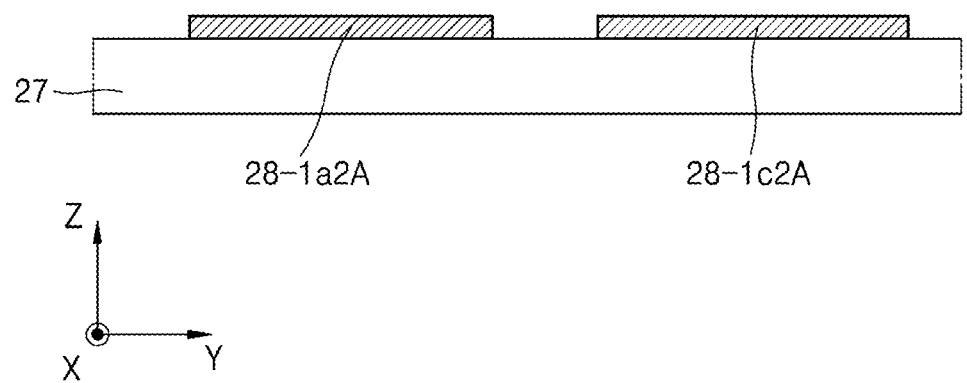
FIGS. 15A to 15M are cross-sectional views or plan views illustrating a display apparatus manufacturing method according to one or more embodiments.

Referring to FIG. 15A, first, a pixel electrode 28-1a2A, 28-1c2A may be formed over a passivation layer 27.

Figure 15B:
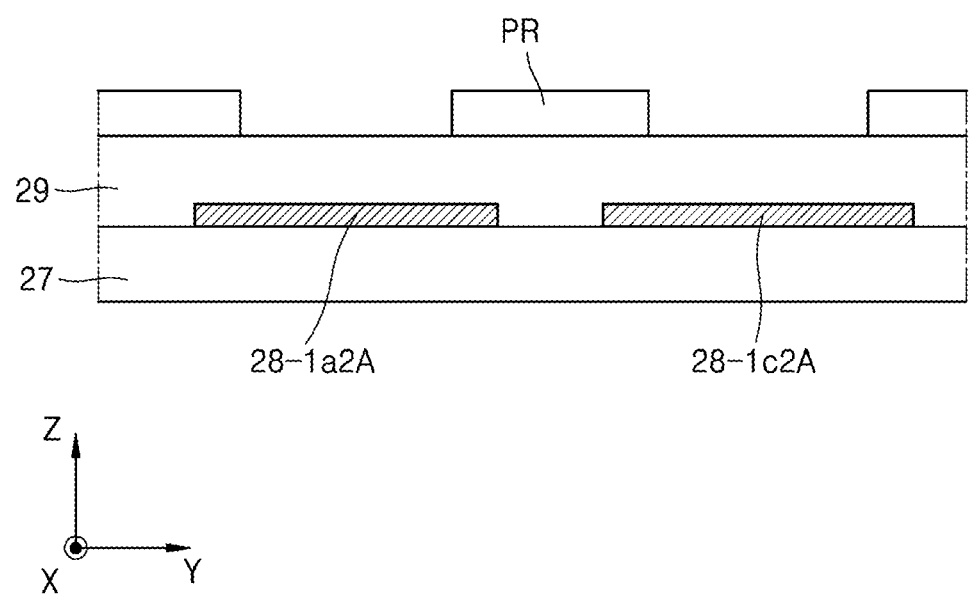
Figure 15C:
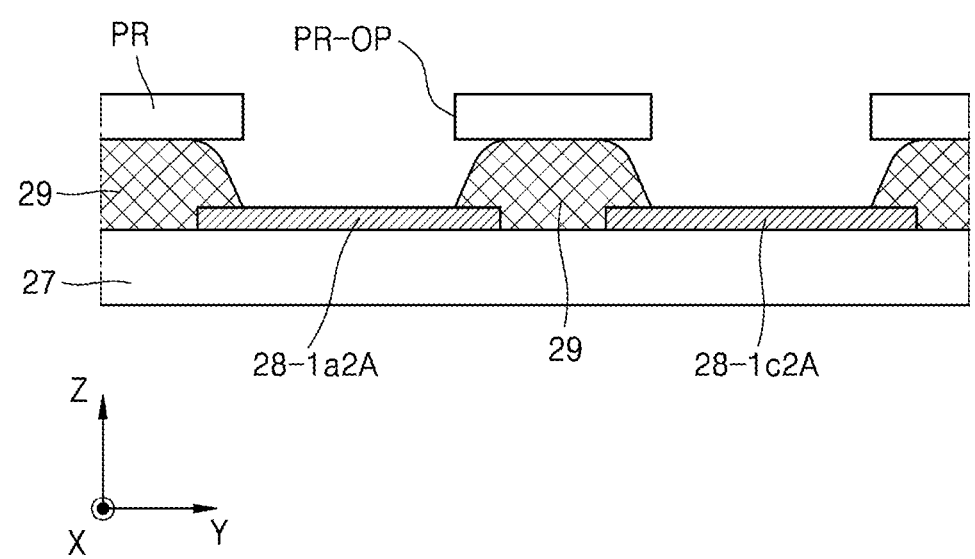

Referring to FIGS. 15B and 15C, a pixel definition layer 29 may be formed over the pixel electrode. A photoresist PR may be arranged over the pixel definition layer 29 and a portion of the photoresist PR may be removed to form an opening area PR-OP. Then an opening area in the pixel definition layer 29 may be formed to expose at least a portion of a (1-1)st pixel electrode, at least a portion of a (1-2)nd pixel electrode 28-1a2A, at least a portion of a (2-1)st pixel electrode, at least a portion of a (2-2)nd pixel electrode, at least a portion of a (3-1)st pixel electrode, and at least a portion of a (3-2)nd pixel electrode 28-1c2A to the outside. In one or more embodiments, when each opening area is initially formed in the pixel definition layer 29, all of the respective opening areas of the pixel definition layer 29 may be set to be formed at equal intervals. When each opening area of the pixel definition layer 29 is formed according to the present embodiments, at least a portion of each pixel electrode may be exposed. In one or more embodiments, the planar center of each opening area of the pixel definition layer 29 and the planar center of each pixel electrode may match with each other in the entire area of the display substrate D.

Thereafter, a first mask sheet 132-1 may be arranged to face the display substrate D, and a first organic emission layer may be formed over the display substrate D through the display apparatus manufacturing apparatus 100 illustrated in FIG. 1.

In one or more embodiments, some of a plurality of first organic emission layers may be formed to include (e.g., entirely include) a first opening area, but some others of the plurality of first organic emission layers may not be formed to completely (e.g., entirely) include a first opening area.

For example, when the first mask sheet 132-1 is tensioned, the interval between the first opening portions may be maintained to be uniform (or substantially uniform) in a portion of the first mask sheet 132-1 arranged to correspond to a first area 1A, and may be different from an initial position or a preset position in a portion of the first mask sheet 132-1 arranged to correspond to a second area 2A and thus, the position of a (1-2)nd organic emission layer 28-2a2A formed in the second area 2A may be different from a preset (e.g., initial) position. In one or more embodiments, the (1-2)nd organic emission layer 28-2a2A may not completely cover (e.g., shield) the (1-2)nd pixel electrode 28-1a2A exposed through a (1-2)nd opening area OP1-2A.

Figure 15D:
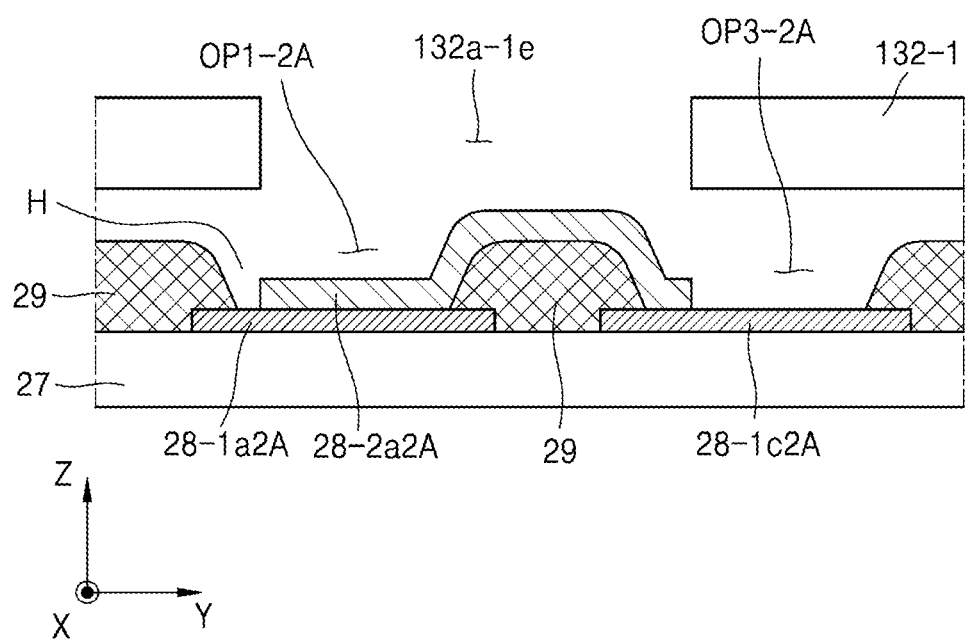
Figure 15E:
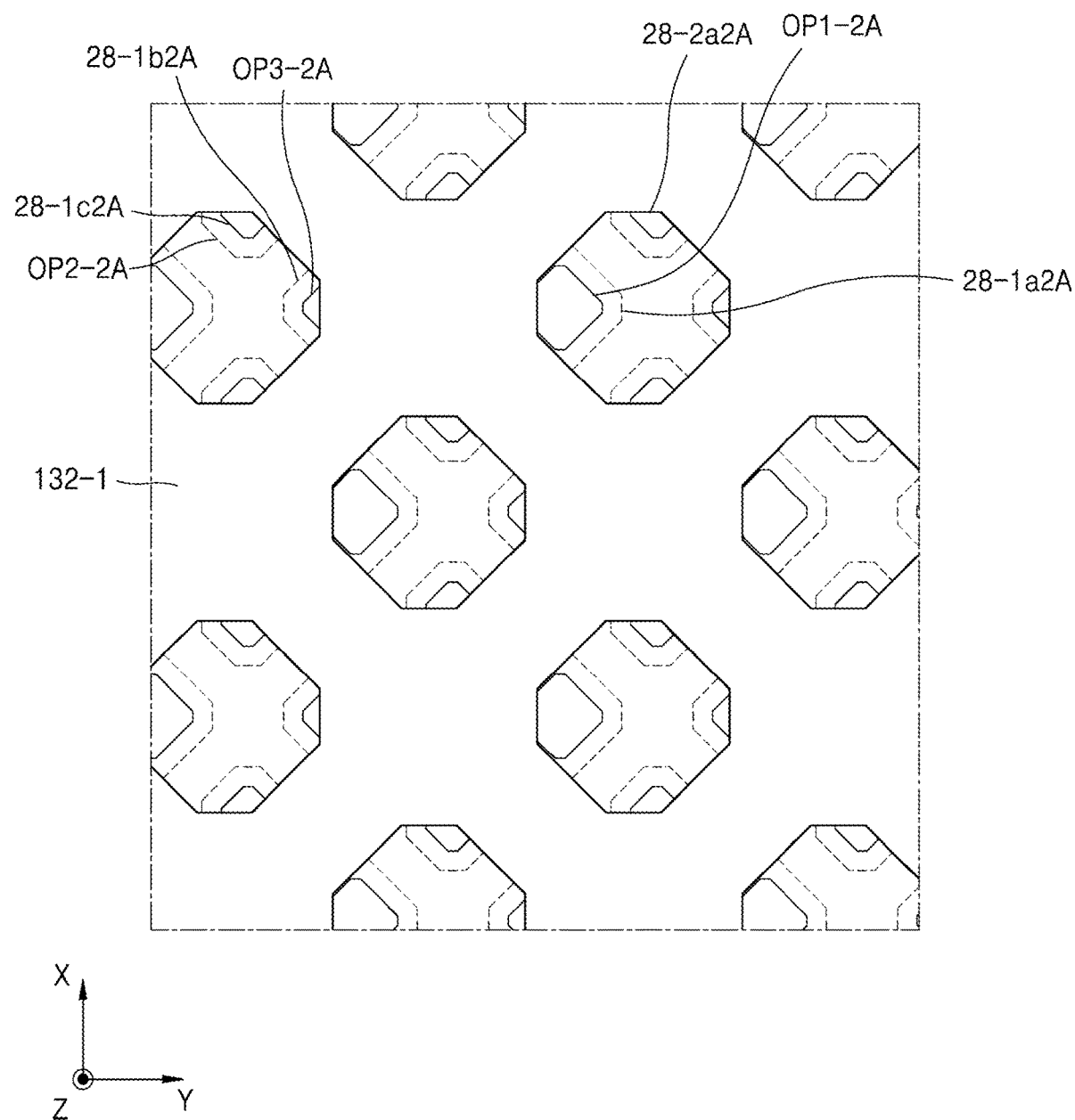
Figure 15F:
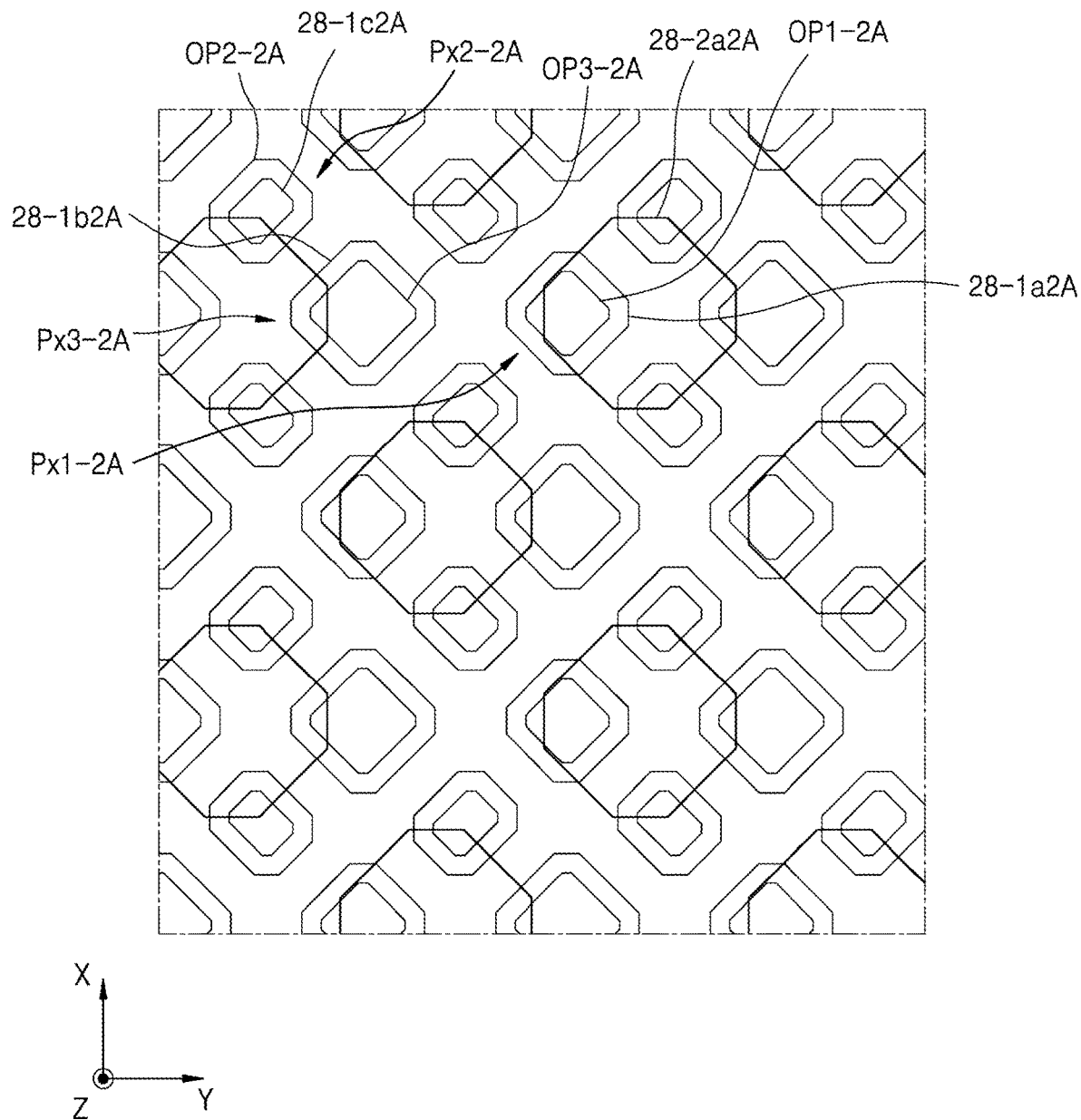

For example, referring to FIGS. 15D to 15F, when a first mask sheet 132-1 is arranged, a (1-5)th opening portion 132a-1e, for example, a (1-5)th opening portion 132a-1e of the first mask sheet 132-1, may be arranged not to include all of the (1-2)nd opening area OP1-2A in the plan view. In one or more embodiments, at least one of at least a portion of a (2-2)nd opening area OP2-2A and at least a portion of a (3-2)nd opening area OP3-2A may be arranged inside the (1-5)th opening portion 132a-1e. In one or more embodiments, a deposition material having passed through the (1-5)th opening portion 132a-1e may be deposited moving to the (1-2)nd opening area OP1-2A. In one or more embodiments, as illustrated in region H of FIG. 15D, deposition may not be performed on a portion of the (1-2)nd pixel electrode 28-1a2A exposed to the outside through the (1-2) nd opening area OP1-2A. In one or more embodiments, as illustrated in region H of FIG. 15D, a deposition material may be deposited on the (3-2)nd pixel electrode 28-1c2A exposed to the (3-2)nd opening area OP3-2A adjacent thereto, and thus, the (1-2)nd organic emission layer 28-2a2A may be arranged over a portion of the (3-2)nd pixel electrode 28-1c2A as well as the (1-2)nd pixel electrode 28-1a2A. For example, the (1-2)nd organic emission layer 28-2a2A may be arranged over at least a portion of the (2-2)nd pixel electrode 28-1b2A exposed to the (2-2)nd opening area OP2-2A.

When the (1-2)nd organic emission layer 28-2a2A is arranged at not only the (1-2)nd pixel electrode 28-1a2A but also at least one of the (2-2)nd pixel electrode 28-1b2A and the (3-2)nd pixel electrode 28-1c2A, light may be mixed and emitted in at least one of the (2-2)nd subpixel Px2-2A and the (3-2)nd subpixel Px3-2A, and thus there may be a limitation in the display apparatus 20 itself implementing a clear image. In addition, because there may be an area in which the (1-2)nd organic emission layer 28-2a2A is not in a portion of the (1-2)nd pixel electrode 28-1a2A, there may be a problem in that the area of light emitted from the (1-2)nd subpixel Px1-2A is small and/or blurred.

In the above case, the manufactured display apparatus 20 may not implement a clear image and the manufacturing time and cost thereof may increase, for example, when the apparatus is determined to be defective.

Figure 15G:
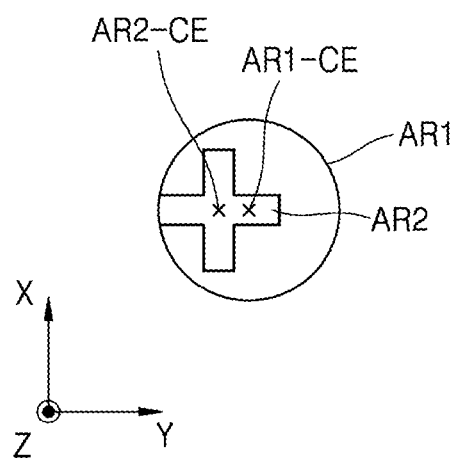

Referring to FIG. 15G, when the organic emission layer does not completely cover the corresponding opening area as in the present embodiments, the degree of deviation between the first mask sheet 132-1 and the substrate 21 may be calculated. For example, a first alignment mark AR1 arranged at the substrate 21 and a second alignment mark AR2 formed at the first mask sheet 132-1 may be photographed by the vision unit 180 illustrated in FIG. 1. The vision unit 180 may transmit an obtained image thereof to a controller, and the controller may compare the positions of the first alignment mark AR1 and the second alignment mark AR2 to calculate the deformation degree of the first mask sheet 132-1. For example, the controller may calculate the deformation degree of the first mask sheet 132-1 based on the interval between the center of the first alignment mark AR1-CE and the center of the second alignment mark AR2-CE, the direction thereof, and/or the like. In other one or more embodiments, the deformation degree of the first mask sheet 132-1 may be calculated by observing the substrate where the organic emission layer is actually formed, by using an electron microscope and/or the like. In one or more embodiments, the deformation degree of the first mask sheet 132-1 may be calculated through the positions of the planar (e.g., in a plan view) center of the organic emission layer and the planar (e.g., in a plan view) center of the opening area. In one or more embodiments, the controller may be in the state of prestoring an equation for calculating the deformation degree of the first mask sheet 132-1 according to the embodiments of the present disclosure, or may be in the state of prearranging and prestoring the deformation degree of the first mask sheet 132-1 in a table form according to the embodiments of the present disclosure.

Figure 15H:
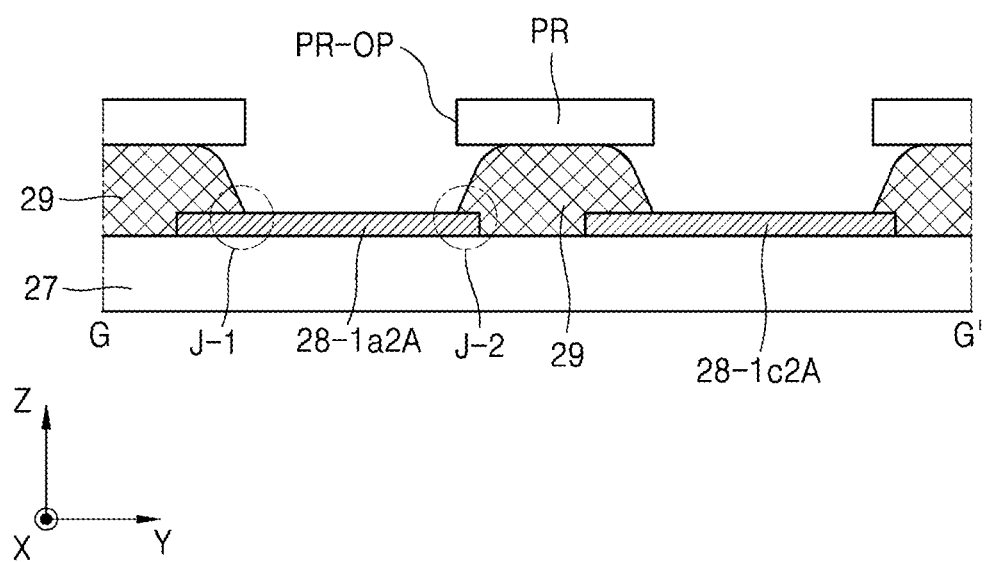
Figure 15I:
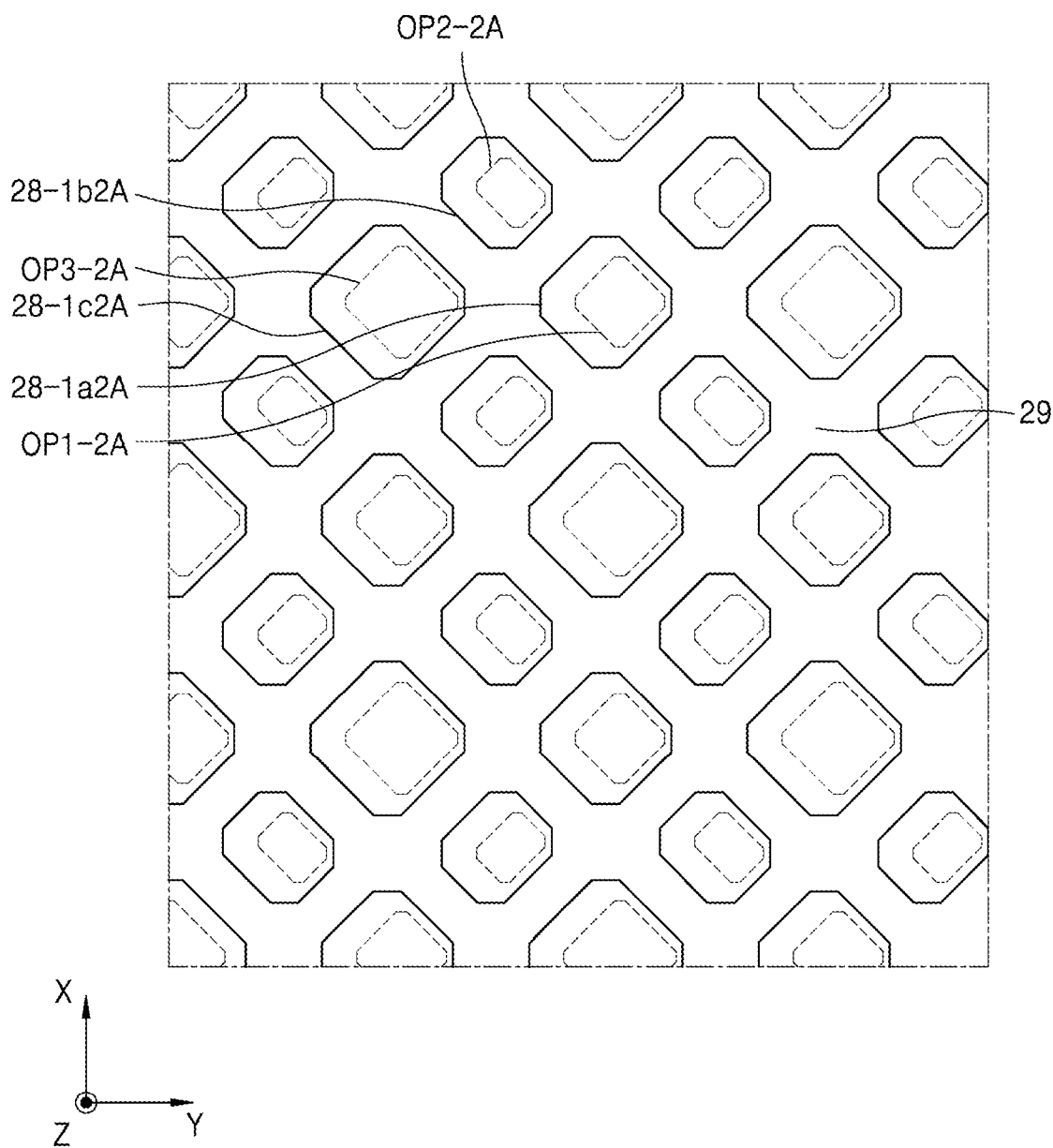

Referring to FIGS. 15H and 15I, the controller may calculate the position of the first opening portion according to the deformation degree of the first mask sheet 132-1 calculated as described herein. The controller may use this information as information for applying and developing the photoresist PR when forming the opening area of the pixel definition layer 29.

In one or more embodiments, the controller may form a photoresist PR over the pixel definition layer 29 and may shift an opening portion PR-OP formed in the photoresist PR to form the (1-2)nd opening area OP1-2A, from the existing position thereof. For example, the controller may arrange the center of the opening portion of the photoresist PR at a position different from the position of the center of a (1-2)nd pixel electrode 28-1a2A.

When the (1-2)nd opening area OP1-2A is formed in the pixel definition layer 29 after changing the center of the opening portion of the photoresist PR from a position matching with the center of the (1-2)nd pixel electrode 28-1a2A to a position mismatching with the center of the (1-2)nd pixel electrode 28-1a2A, the center of the (1-2)nd opening area OP1-2A may not match with the center of the (1-2)nd pixel electrode 28-1a2A. In this case, the length of one of the ends of the (1-2)nd pixel electrode 28-1a2A inserted into the pixel definition layer 29 in one direction may be different from the length of another of the ends of the (1-2)nd pixel electrode 28-1a2A inserted into the pixel definition layer 29. For example, the length of one of the ends of the (1-2)nd pixel electrode 28-1a2A inserted into the pixel definition layer 29 in one direction may be greater or less than the length of another of the ends of the (1-2)nd pixel electrode 28-1a2A inserted into the pixel definition layer 29 (see e.g., region J-1 and region J-2 of FIG. 15H)

The above process may be performed on both the (2-2)nd opening area OP2-2A and the (3-2)nd opening area OP3-2A in addition to the (1-2)nd opening area OP1-2A. In one or more embodiments, although it has been described above that the process of the present embodiments is applied in the process of forming the (2-2)nd opening area OP2-2A and the (3-2)nd opening area OP3-2A in addition to the (1-2)nd opening area OP1-2A, the present embodiments are not limited thereto. For example, when it is determined that the position of the opening portion of the mask sheet corresponding to the opening area arranged in the first area 1A is different from a preset position, such operation may also be performed on the opening area of the first area 1A. For example, when it is determined that the position of the opening portion of the mask sheet corresponding to the opening area of the second area 2A is not different from a preset position, the above operation may not performed on the opening area of the second area 2A and an opening area may be formed in the pixel definition layer such that the center of the opening area and the center of the pixel electrode body match with each other, as in the existing operation.

Figure 15J:
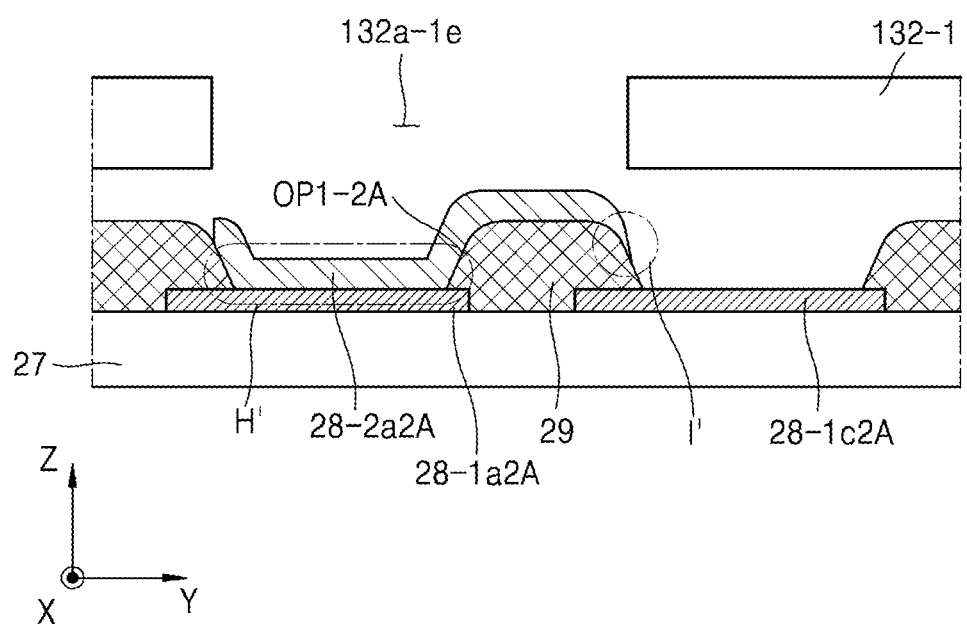
Figure 15K:
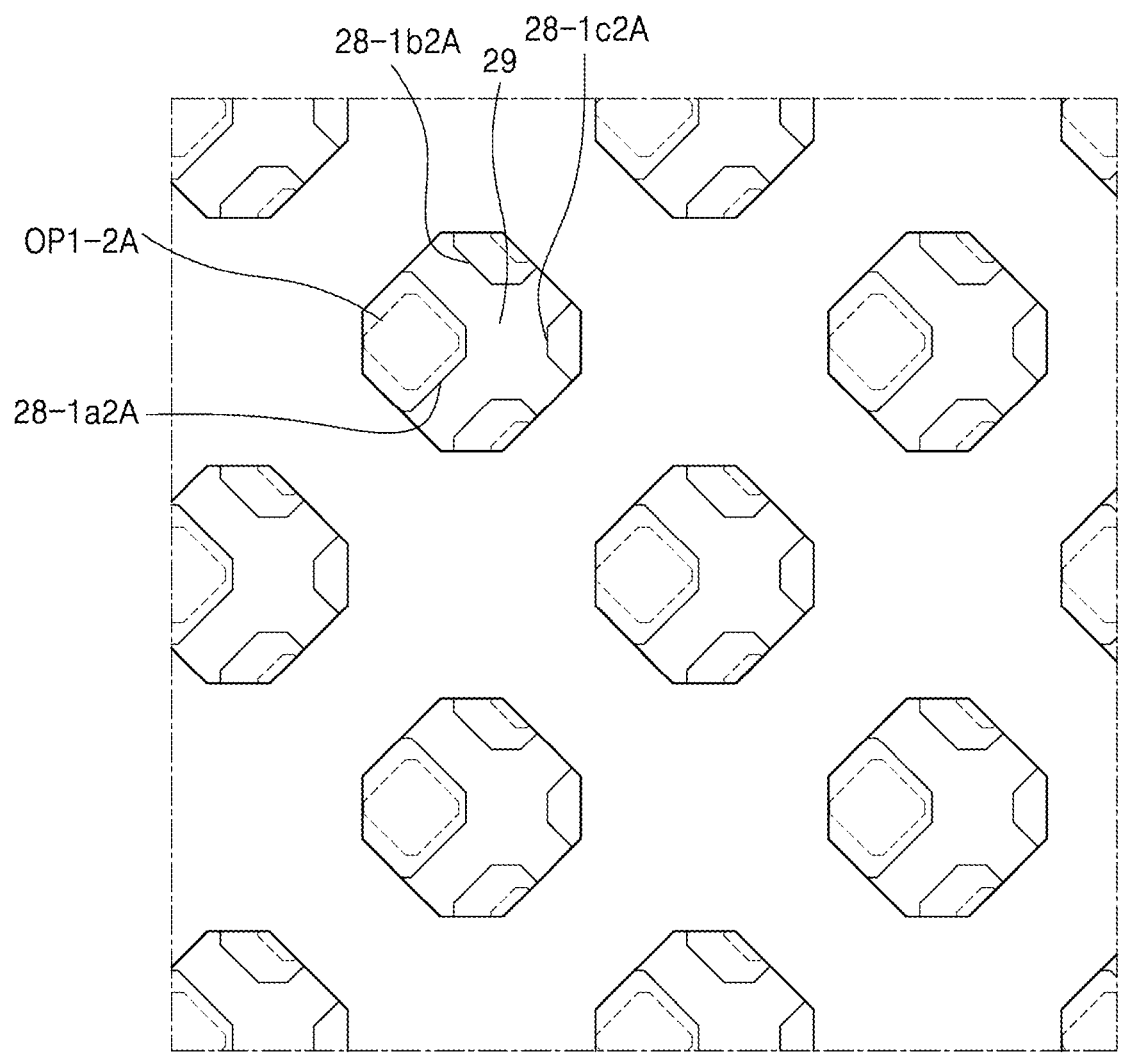

Referring to FIGS. 15J and 15K, after the position of the (1-2)nd opening area OP1-2A over the pixel definition layer 29 is shifted in at least one direction based on the initially set position, a (1-1)st organic emission layer 28-2a1A may be formed through the display apparatus manufacturing apparatus illustrated in FIG. 1.

In one or more embodiments, when the first mask sheet 132-1 is arranged, all of the (1-2)nd pixel electrode 28-1a2A may be exposed to the outside through the first opening portion in the plan view. In one or more embodiments, a deposition material deposited through the first opening portion may form a (1-2)nd organic emission layer 28-2a2A arranged to completely cover the (1-2)nd opening area OP1-2A.

When the (1-2)nd organic emission layer 28-2a2A is formed as above, the (1-2)nd organic emission layer 28-2a2A may cover all of the (1-2)nd pixel electrode 28-1a2A exposed to the outside through the (1-2)nd opening area OP1-2A (region H' of FIG. 15J). Also, the (1-2)nd organic emission layer 28-2a2A may not be arranged over the (3-2)nd pixel electrode 28-1c2A of the (3-2)nd subpixel Px3-2A adjacent thereto (region I' of FIG. 15J).

The above operation may be applied to both the second mask sheet 132-2 and the third mask sheet 132-3 as well as to the first mask sheet 132-1. In one or more embodiments, the position of the opening area of each subpixel corresponding to the position of the second opening portion and the third opening portion calculated as being different from the initial position or the preset position due to the deformation of the second mask sheet 132-2 and the third mask sheet 132-3, respectively, may be shifted with respect to the initially set position of each subpixel opening area.

In one or more embodiments, the opening area of the pixel definition layer 29 may be individually adjusted to correspond to the deformation of each mask sheet.

Figure 15L:
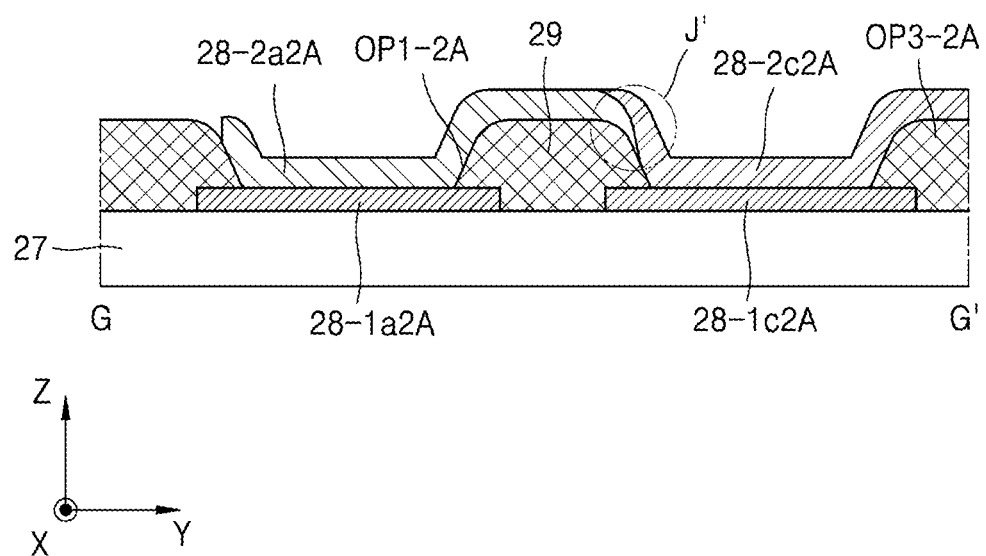
Figure 15M:
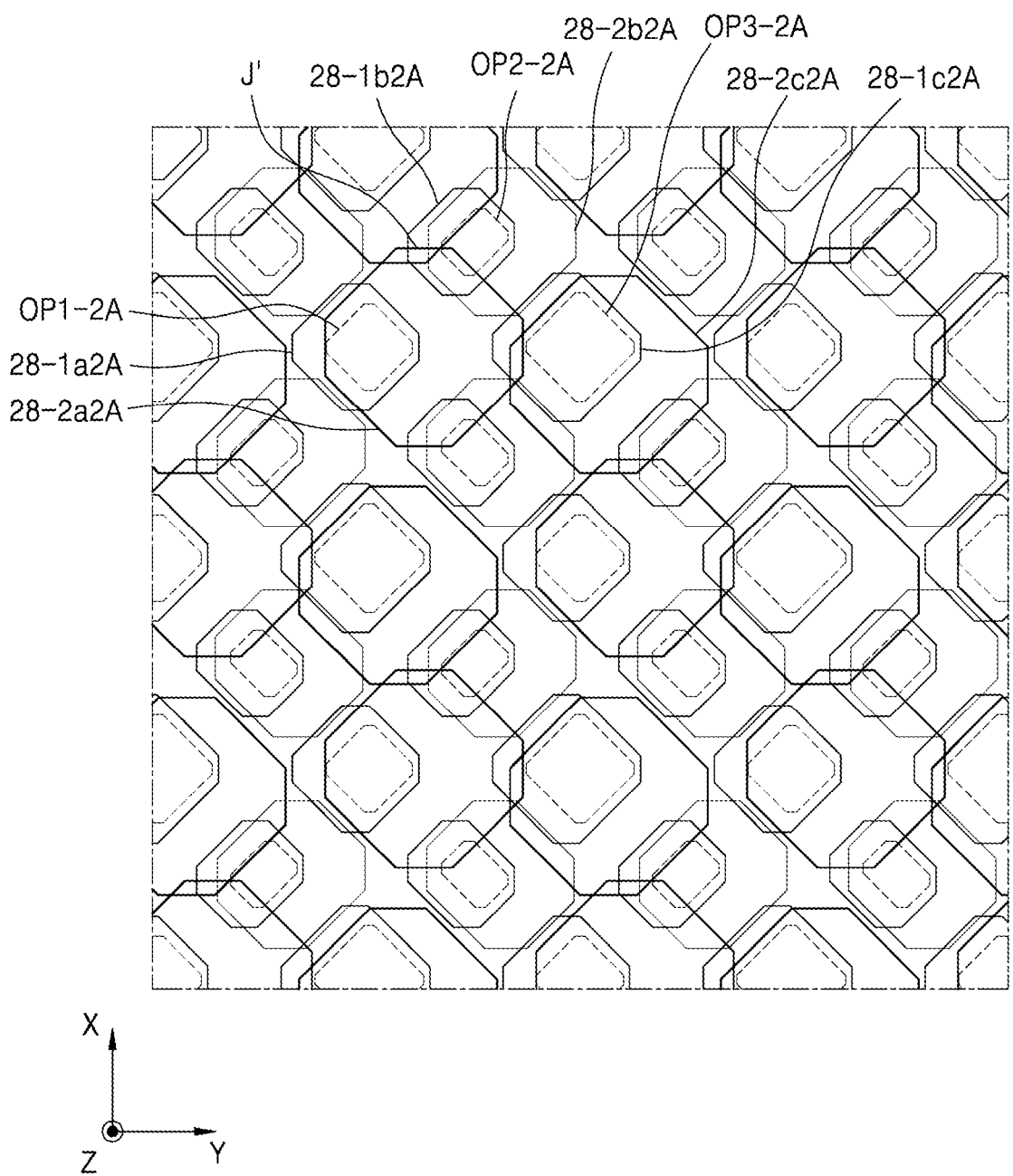

Referring to FIGS. 15L and 15M, when the positions of the opening areas are individually adjusted as above, the organic emission layers that are adjacent to each other and emit different colors may include subpixels that at least partially overlap each other. For example, when at least one of the (1-2)nd opening area OP1-2A, the (2-2)nd opening area OP2-2A, and the (3-2)nd opening area OP3-2A is shifted and formed as in region J' illustrated in FIGS. 15L and 15M, one of the (1-2)nd organic emission layer 28-2a2A, the (2-2)nd organic emission layer 28-2b2A, and the (3-2)nd organic emission layer 28-2c2A may overlap another of the (1-2)nd organic emission layer 28-2a2A, the (2-2)nd organic emission layer 28-2b2A, and the (3-2)nd organic emission layer 28-2c2A in the plan view. In one or more embodiments, a portion of one of the (1-2)nd organic emission layer 28-2a2A, the (2-2)nd organic emission layer 28-2b2A, and the (3-2)nd organic emission layer 28-2c2A overlapping another of the (1-2)nd organic emission layer 28-2a2A, the (2-2)nd organic emission layer 28-2b2A, and the (3-2)nd organic emission layer 28-2c2A in the plan view may be over the pixel definition layer 29. Thus, light may not be emitted because power is not applied to a portion where the organic emission layers overlap each other as above.

Thus, the display apparatus manufacturing method described above may solve the problem of the organic emission layer failing to completely cover the opening area according to the deformation of the mask sheet. Also, the display apparatus manufacturing method may allow each subpixel to emit clear light by arranging the organic emission layer to cover the entire pixel electrode exposed to the opening area.

According to the display apparatus manufacturing method, the deposition material may be deposited at an accurate position by adjusting the position of the opening area to reflect the deformation of the mask sheet.

The display apparatus according to the embodiments may implement a clear image. According to the display apparatus manufacturing method according to the embodiments, the organic emission layer may be accurately deposited on the pixel electrode exposed to the outside.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims and their equivalents.

What is claimed is:

1. A display apparatus comprising:
    a substrate;
    a pixel definition layer over the substrate, the pixel definition layer comprising at least one opening area;
    an
    an organic emission layer over the pixel definition layer and covering the opening area,
    wherein a center of the opening area and a center of the organic emission layer are at different positions in plan view, and
    wherein an end of the organic emission layer overlaps the opening area in plan view.

2. The display apparatus of claim 1, wherein a bottom of the opening area is inside the organic emission layer in a plan view.

3. The display apparatus of claim 1, further comprising a pixel electrode on the substrate and the pixel definition layer, the pixel electrode being exposed to the outside through the opening area.

4. The display apparatus of claim 3, wherein a center of the pixel electrode is at a different position than at least one of the center of the organic emission layer and the center of the opening area in plan view.

5. The display apparatus of claim 3, wherein a first length of a first portion of the pixel electrode at one of two ends of the opening area along one direction and inside the pixel definition layer, is different from a second length of a second portion of the pixel electrode at another of the two ends of the opening area and inside the pixel definition layer.

6. The display apparatus of claim 1, wherein a distance from the center of the opening area to one of ends of the organic emission layer along one direction is different from a distance from the center of the opening area to another of the ends of the organic emission layer.

7. The display apparatus of claim 1, wherein a linear distance from an edge of the opening area to an edge of the organic emission layer is different at two set points on the edge of the opening area.

8. The display apparatus of claim 1, wherein the organic emission layer comprises an organic emission layer that emits one of red, green, or blue colors.

9. A display apparatus comprising:
    a substrate;
    a pixel definition layer over the substrate, the pixel definition layer comprising a plurality of opening areas; and
    a plurality of organic emission layers over the pixel definition layer and respectively covering each of the plurality of opening areas,
    wherein a first distance between a center of a first organic emission layer among the plurality of organic emission layers and a center of a first opening area among the plurality of opening areas and corresponding to the first organic emission layer in a plan view is different from a second distance between a center of a second organic emission layer among the plurality of organic emission layers and a center of a second opening area among the plurality of opening areas and corresponding to the second organic emission layer in plan view.

10. The display apparatus of claim 9, wherein the first organic emission layer and the second organic emission layer are to emit a same color.

11. The display apparatus of claim 9, wherein the center of the first organic emission layer and the center of the first opening area are aligned with each other.

12. The display apparatus of claim 9, wherein a distance from an edge of the first organic emission layer to an edge of the first opening area is uniform along the edge of the first opening area.

13. The display apparatus of claim 9, wherein a distance from an edge of the second organic emission layer to an edge of the second opening area is different in at least two points on the edge of the second opening area.

14. The display apparatus of claim 9, wherein at least one of the first organic emission layer and the second organic emission layer overlaps, in a plan view, one or more of the plurality of organic emission layers that emit a color different from a color that the first organic emission layer and the second organic emission layer are to emit.

15. A method of manufacturing a display apparatus, the method comprising:
    aligning a mask sheet with a display substrate;
    when a position of the mask sheet and a position of the display substrate are misaligned with each other, shifting at least one of a plurality of opening areas of a pixel definition layer to a position different from an existing position thereof; and
    depositing a deposition material that passed through an opening portion of the mask sheet, in an opening area of the pixel definition layer.

16. The method of claim 15, wherein the opening area of the pixel definition layer is shifted such that a center of a pixel electrode arranged under the pixel definition layer and a center of the opening area are misaligned with each other.

17. The method of claim 15, wherein the deposition material entirely covers the opening area.

18. The method of claim 15, wherein a center of the opening portion of the mask sheet is misaligned with a center of the opening area.

19. The method of claim 15, wherein the opening area comprises a plurality of opening areas, and
    the opening portion overlaps one of the plurality of opening areas in a plan view.

* * * * *